United States Patent [19]
Walsh

[11] Patent Number: 5,646,618
[45] Date of Patent: Jul. 8, 1997

[54] DECODING ONE OR MORE VARIABLE-LENGTH ENCODED SIGNALS USING A SINGLE TABLE LOOKUP

[75] Inventor: Thomas E. Walsh, Portland, Oreg.

[73] Assignee: Intel Corporation, Santa Clara, Calif.

[21] Appl. No.: 558,258

[22] Filed: Nov. 13, 1995

Related U.S. Application Data

[60] Provisional application No. 60/001,369, Jul. 21, 1995.
[51] Int. Cl.$^6$ .................................................. H03M 7/40
[52] U.S. Cl. ............................................. 341/67; 341/106
[58] Field of Search ............................... 341/67, 106, 65, 341/99, 50, 51

[56] References Cited

U.S. PATENT DOCUMENTS

| | | |
|---|---|---|
| 3,883,847 | 5/1975 | Frank . |
| 4,369,463 | 1/1983 | Anastassiou . |
| 4,386,416 | 5/1983 | Giltner . |
| 4,396,906 | 8/1983 | Weaver . |
| 4,563,671 | 1/1986 | Lim et al. . |
| 4,574,382 | 3/1986 | Ko . |
| 4,580,162 | 4/1986 | Mori . |
| 4,593,267 | 6/1986 | Kuroda et al. . |
| 4,700,175 | 10/1987 | Bledsoe . |
| 4,706,265 | 11/1987 | Furukawa . |
| 4,813,056 | 3/1989 | Fedele . |
| 4,899,149 | 2/1990 | Kahan . |
| 4,967,196 | 10/1990 | Spraque et al. . |
| 5,045,853 | 9/1991 | Astle et al. . |
| 5,057,917 | 10/1991 | Shalkauser et al. . |
| 5,220,325 | 6/1993 | Ackland et al. . |
| 5,268,769 | 12/1993 | Tsuchiya et al. . |
| 5,304,995 | 4/1994 | Dachiku . |
| 5,329,313 | 7/1994 | Keith . |
| 5,528,628 | 6/1996 | Park et al. ........................ 375/240 |

FOREIGN PATENT DOCUMENTS

| | | |
|---|---|---|
| 0145396 | 6/1985 | European Pat. Off. . |
| WO8905556 | 6/1989 | European Pat. Off. . |

OTHER PUBLICATIONS

"DVI Image Compression—Second Generation," by Stuart J. Golin, Image Processing Algorithms and Techniques III, SPIE vol. 1657, Proceedings of the International Society for Optical Engineering, 1992, pp. 106–113.

Abramson, N., "Information Theory and Coding," McGraw–Hill 1963, pp. 77–92.

"The i750 Video Processor: A Total Multimedia Solution," Communications of the ACM, vol. 34, No. 4, Apr. 1991, New York, pp. 64–78.

Patent Abstracts of Japan, vol. 11, No. 83, (E–489) (2530), Mar. 13, 1987, entitled "Data Processing Method" and JP,A61237520 (Canon, Inc.) 22 Oct. 1986.

*Primary Examiner*—Jeffrey A. Gaffin
*Assistant Examiner*—Jason L. W. Kost
*Attorney, Agent, or Firm*—Steve Mendelsohn; William H. Murray

[57] ABSTRACT

Fixed-length segments of a variable-length encoded (VLE) bitstream are used as indices into a lookup table. The current table entry is interpreted to determine how many complete VLE signals are in current bitstream segment. If the segment contains one or more complete VLE signals, then the corresponding decoded signals are retrieved from the table entry. Otherwise, if the segment contains no complete VLE signals, then special processing is performed to decode the segment.

39 Claims, 28 Drawing Sheets

STATISTICAL DECODING

FIG. 1. ENCODING SYSTEM

FIG. 2. DECODING SYSTEM

FIG. 3. COMPRESSION PROCESSING

FIG. 5. ENCODER

FIG. 6. ENCODE PROCESSING

FIG. 7

|    | 0 | 1 | 2 | 3 | 4 | 5 | 6 | 7 | 8 | 9 | 10 | 11 | 12 | 13 | 14 | 15 |
|----|---|---|---|---|---|---|---|---|---|---|----|----|----|----|----|----|
| 0  | X |   |   |   | X |   |   |   | X |   |    |    | X  |    |    |    |
| 1  |   |   |   |   |   |   |   |   |   |   |    |    |    |    |    |    |
| 2  |   |   |   |   |   |   |   |   |   |   |    |    |    |    |    |    |
| 3  |   |   |   |   |   |   |   |   |   |   |    |    |    |    |    |    |
| 4  | X |   |   |   | X |   |   |   | X |   |    |    | X  |    |    |    |
| 5  |   |   |   |   |   |   |   |   |   |   |    |    |    |    |    |    |
| 6  |   |   |   |   |   |   |   |   |   |   |    |    |    |    |    |    |
| 7  |   |   |   |   |   |   |   |   |   |   |    |    |    |    |    |    |
| 8  | X |   |   |   | X |   |   |   | X |   |    |    | X  |    |    |    |
| 9  |   |   |   |   |   |   |   |   |   |   |    |    |    |    |    |    |
| 10 |   |   |   |   |   |   |   |   |   |   |    |    |    |    |    |    |
| 11 |   |   |   |   |   |   |   |   |   |   |    |    |    |    |    |    |
| 12 | X |   |   |   | X |   |   |   | X |   |    |    | X  |    |    |    |
| 13 |   |   |   |   |   |   |   |   |   |   |    |    |    |    |    |    |
| 14 |   |   |   |   |   |   |   |   |   |   |    |    |    |    |    |    |
| 15 |   |   |   |   |   |   |   |   |   |   |    |    |    |    |    |    |

FIG. 8

|    | 0 | 1 | 2 | 3 | 4 | 5 | 6 | 7 | 8 | 9 | 10 | 11 | 12 | 13 | 14 | 15 |
|----|---|---|---|---|---|---|---|---|---|---|----|----|----|----|----|----|
| 0  | X |   | X |   | X |   | X |   | X |   | X  |    | X  |    | X  |    |
| 1  |   |   |   |   |   |   |   |   |   |   |    |    |    |    |    |    |
| 2  | X |   | X |   | X |   | X |   | X |   | X  |    | X  |    | X  |    |
| 3  |   |   |   |   |   |   |   |   |   |   |    |    |    |    |    |    |
| 4  | X |   | X |   | X |   | X |   | X |   | X  |    | X  |    | X  |    |
| 5  |   |   |   |   |   |   |   |   |   |   |    |    |    |    |    |    |
| 6  | X |   | X |   | X |   | X |   | X |   | X  |    | X  |    | X  |    |
| 7  |   |   |   |   |   |   |   |   |   |   |    |    |    |    |    |    |
| 8  | X |   | X |   | X |   | X |   | X |   | X  |    | X  |    | X  |    |
| 9  |   |   |   |   |   |   |   |   |   |   |    |    |    |    |    |    |
| 10 | X |   | X |   | X |   | X |   | X |   | X  |    | X  |    | X  |    |
| 11 |   |   |   |   |   |   |   |   |   |   |    |    |    |    |    |    |
| 12 | X |   | X |   | X |   | X |   | X |   | X  |    | X  |    | X  |    |
| 13 |   |   |   |   |   |   |   |   |   |   |    |    |    |    |    |    |
| 14 | X |   | X |   | X |   | X |   | X |   | X  |    | X  |    | X  |    |
| 15 |   |   |   |   |   |   |   |   |   |   |    |    |    |    |    |    |

FIG. 9

|    | 0 | 1 | 2 | 3 | 4 | 5 | 6 | 7 | 8 | 9 | 10 | 11 | 12 | 13 | 14 | 15 |
|----|---|---|---|---|---|---|---|---|---|---|----|----|----|----|----|----|
| 0  | X | X | X | X | X | X | X | X | X | X | X  | X  | X  | X  | X  | X  |
| 1  | X | X | X | X | X | X | X | X | X | X | X  | X  | X  | X  | X  | X  |
| 2  | X | X | X | X | X | X | X | X | X | X | X  | X  | X  | X  | X  | X  |
| 3  | X | X | X | X | X | X | X | X | X | X | X  | X  | X  | X  | X  | X  |
| 4  | X | X | X | X | X | X | X | X | X | X | X  | X  | X  | X  | X  | X  |
| 5  | X | X | X | X | X | X | X | X | X | X | X  | X  | X  | X  | X  | X  |
| 6  | X | X | X | X | X | X | X | X | X | X | X  | X  | X  | X  | X  | X  |
| 7  | X | X | X | X | X | X | X | X | X | X | X  | X  | X  | X  | X  | X  |
| 8  | X | X | X | X | X | X | X | X | X | X | X  | X  | X  | X  | X  | X  |
| 9  | X | X | X | X | X | X | X | X | X | X | X  | X  | X  | X  | X  | X  |
| 10 | X | X | X | X | X | X | X | X | X | X | X  | X  | X  | X  | X  | X  |
| 11 | X | X | X | X | X | X | X | X | X | X | X  | X  | X  | X  | X  | X  |
| 12 | X | X | X | X | X | X | X | X | X | X | X  | X  | X  | X  | X  | X  |
| 13 | X | X | X | X | X | X | X | X | X | X | X  | X  | X  | X  | X  | X  |
| 14 | X | X | X | X | X | X | X | X | X | X | X  | X  | X  | X  | X  | X  |
| 15 | X | X | X | X | X | X | X | X | X | X | X  | X  | X  | X  | X  | X  |

FIG. 13. GENERATION OF QUANTIZATION TABLES

FIG. 14. ADAPTIVE RUN-LENGTH SCAN PATTERN

FIG. 15

|   | 0 | 1 | 2 | 3 |
|---|---|---|---|---|
| 0 | 48 | 20 | 68 | 31 |
| 1 | 50 | 130 | 103 | 62 | ← 1502
| 2 | 100 | 80 | 97 | 49 |
| 3 | 39 | 65 | 52 | 10 |

|   | 0 | 1 | 2 | 3 |
|---|---|---|---|---|
| 0 | 12 | 15 | 6 | 14 |
| 1 | 10 | 1 | 2 | 8 | ← 1504
| 2 | 3 | 5 | 4 | 11 |
| 3 | 13 | 7 | 9 | 16 |

|   | 0 | 1 | 2 | 3 |
|---|---|---|---|---|
| 0 | 12 | 15 | 6 | 14 |
| 1 | 11 | 1 | 2 | 7 | ← 1506
| 2 | 4 | 5 | 3 | 10 |
| 3 | 13 | 8 | 9 | 16 |

FIG. 16.  DECOMPRESSION PROCESSING
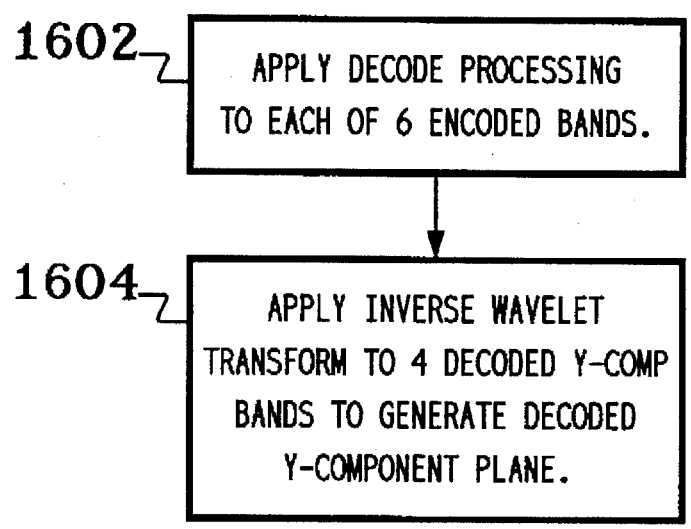

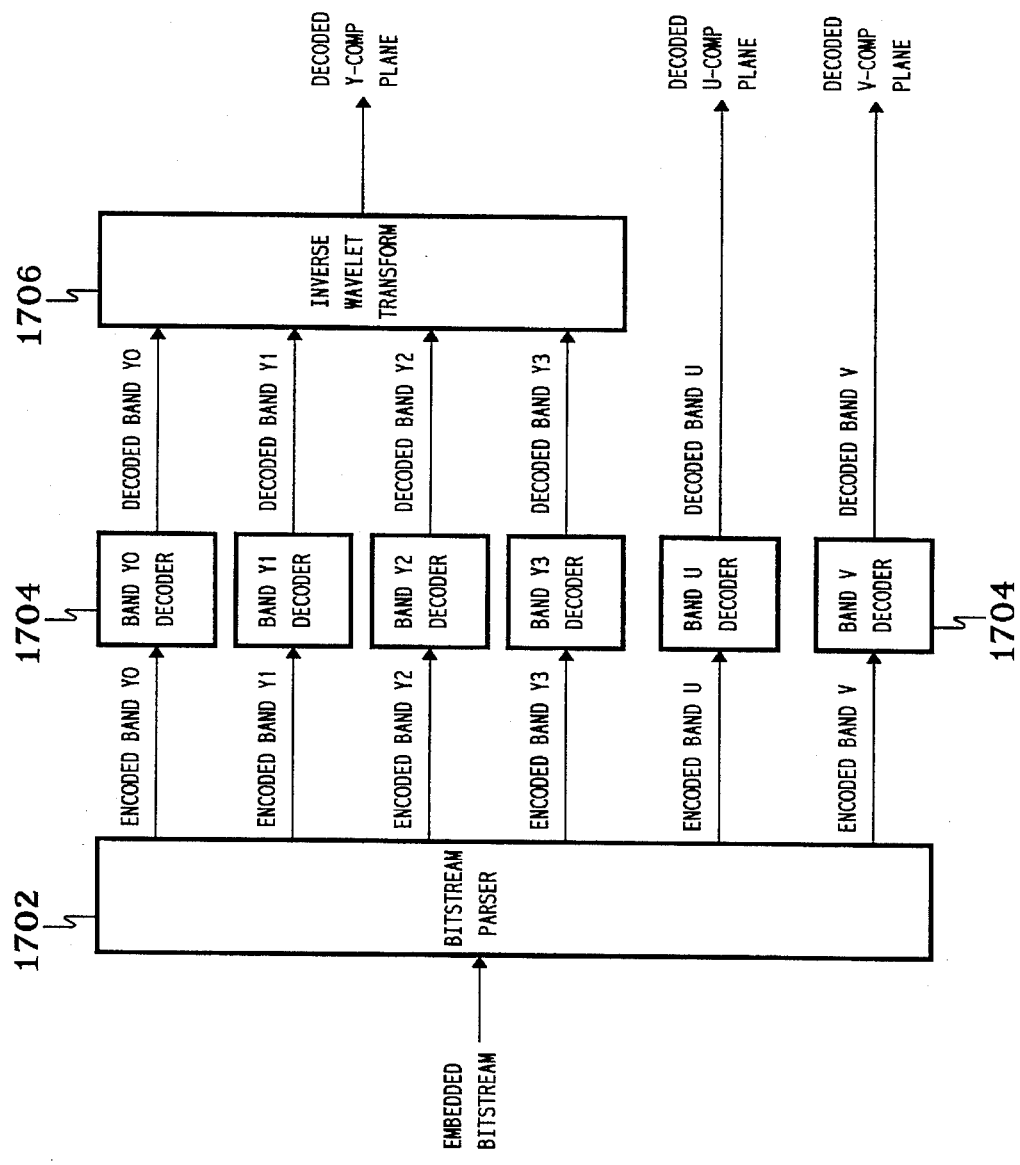
FIG. 17. DECODER

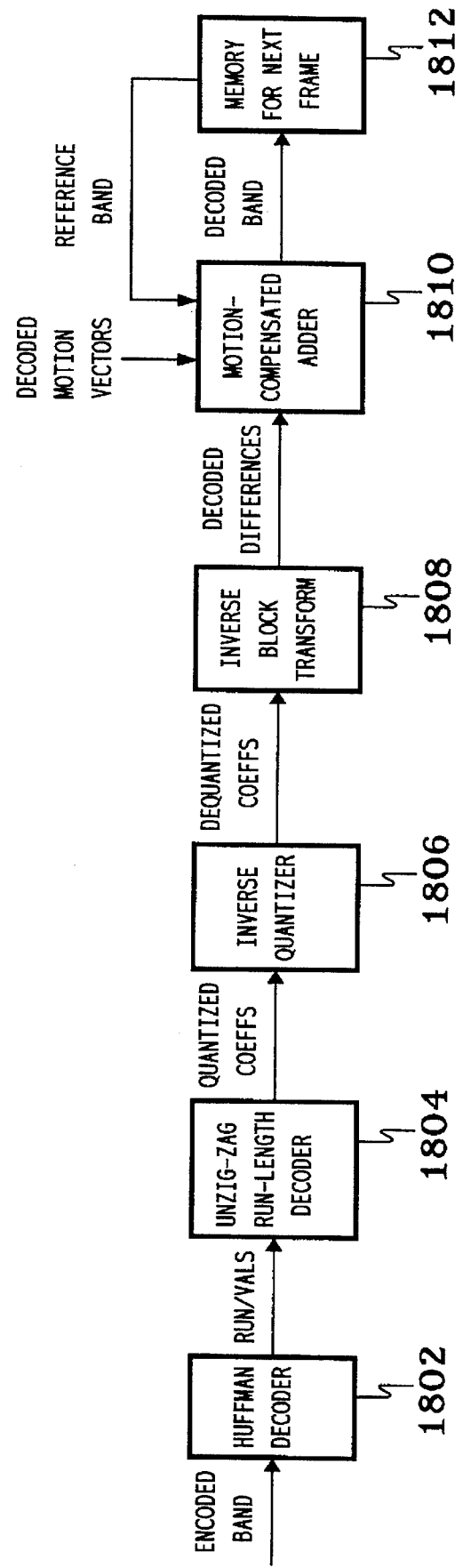
FIG. 18. DECODE PROCESSING

FIG. 19. GENERATION OF QUANTIZATION TABLES
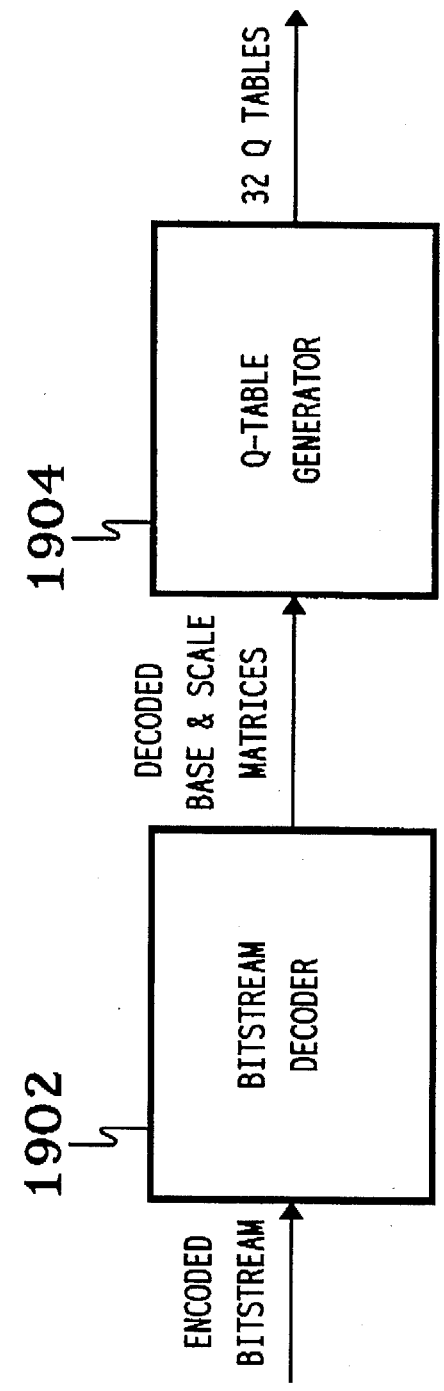

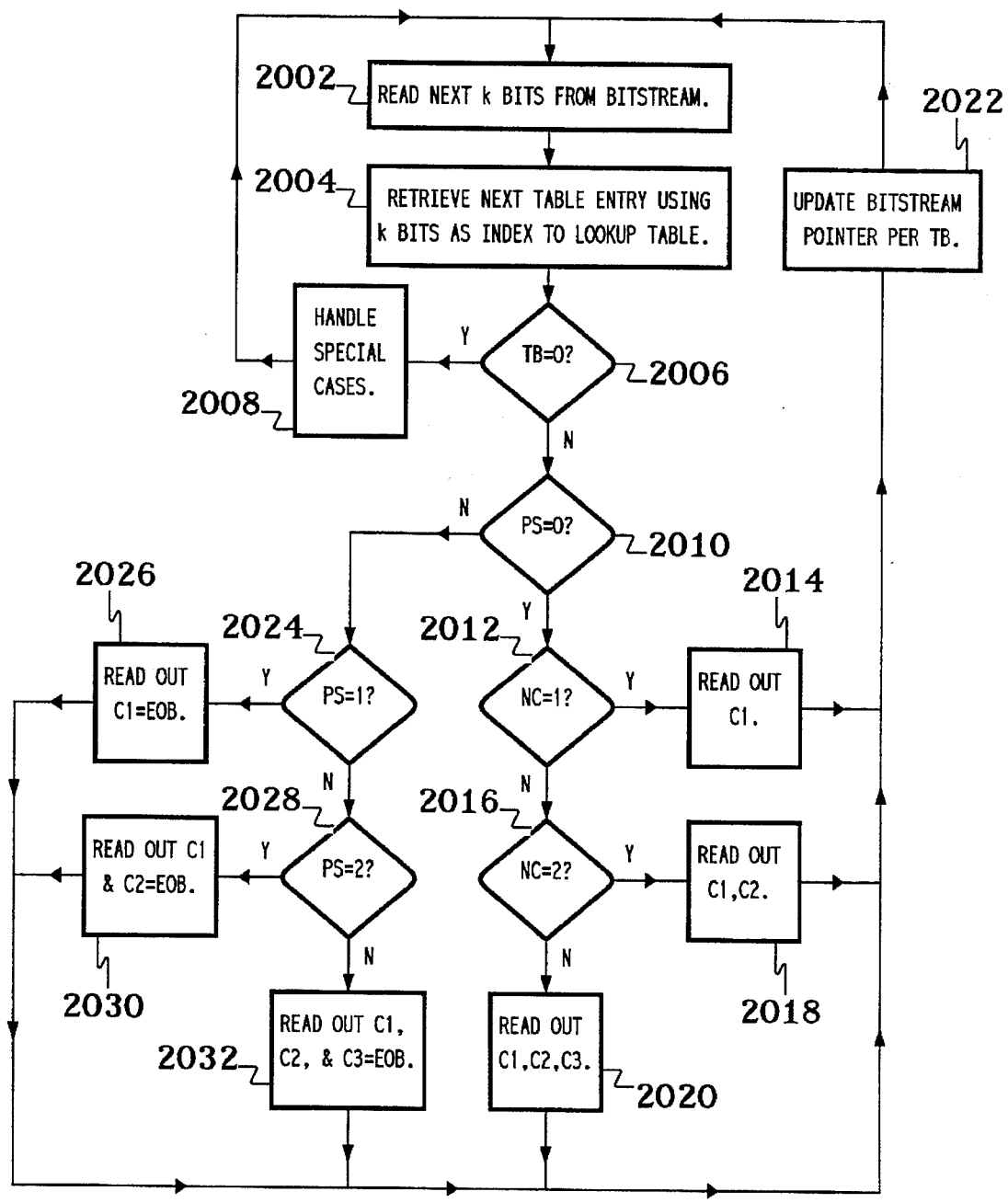
FIG. 20. STATISTICAL DECODING

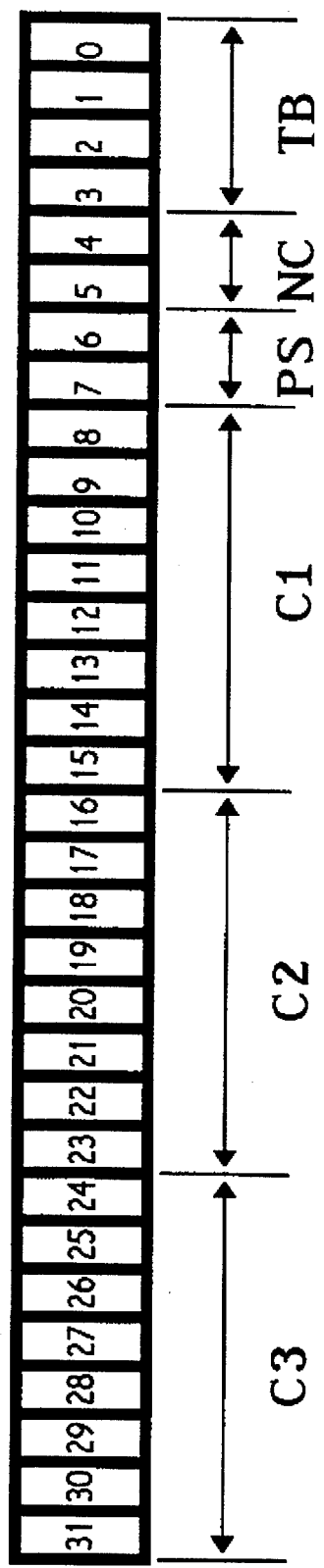
FIG. 21. STATISTICAL DECODING TABLE ENTRY

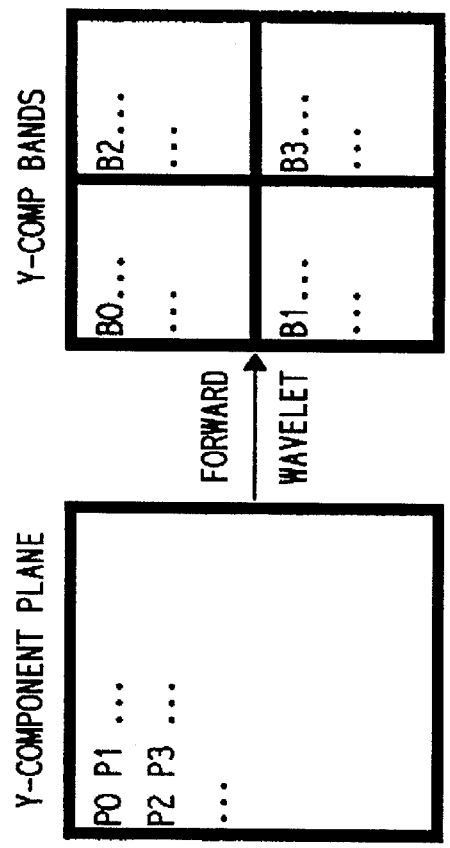
FIG. 22. FORWARD WAVELET TRANSFORM

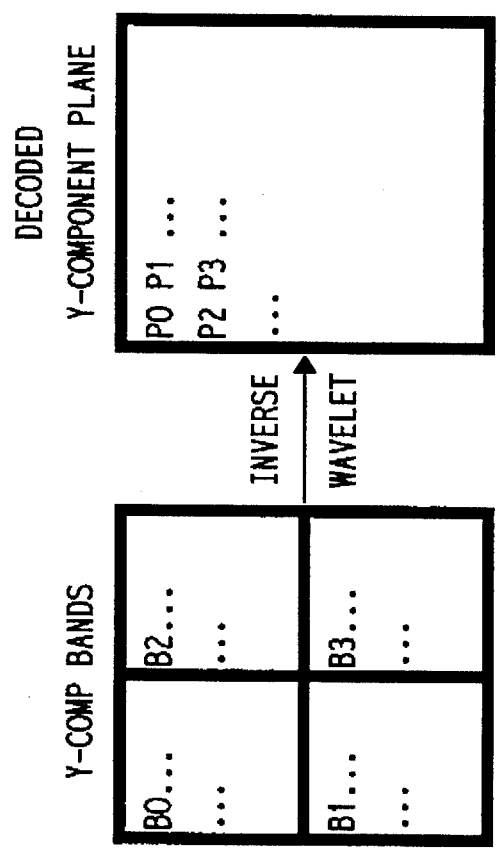
FIG. 23. INVERSE WAVELET TRANSFORM

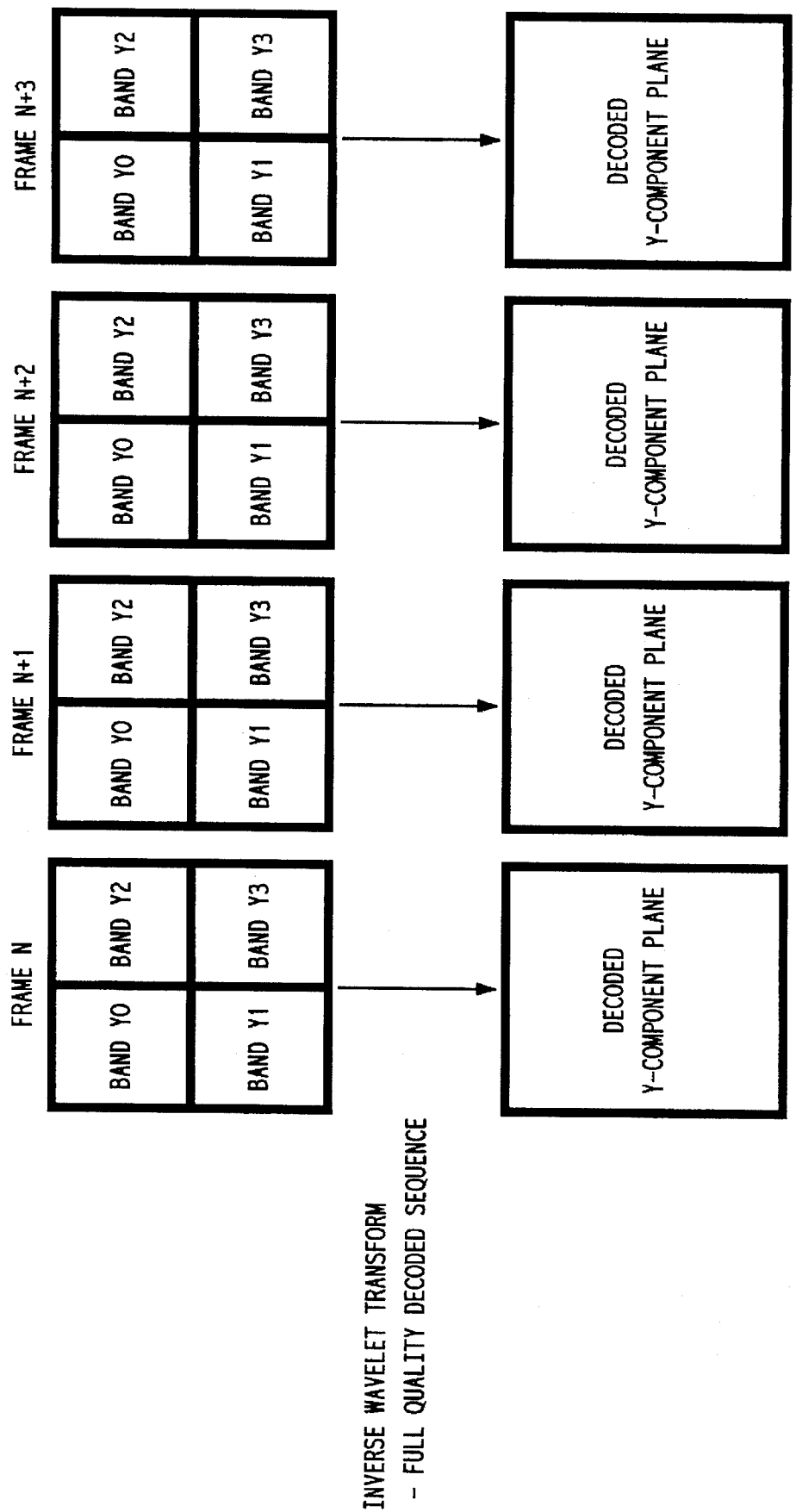

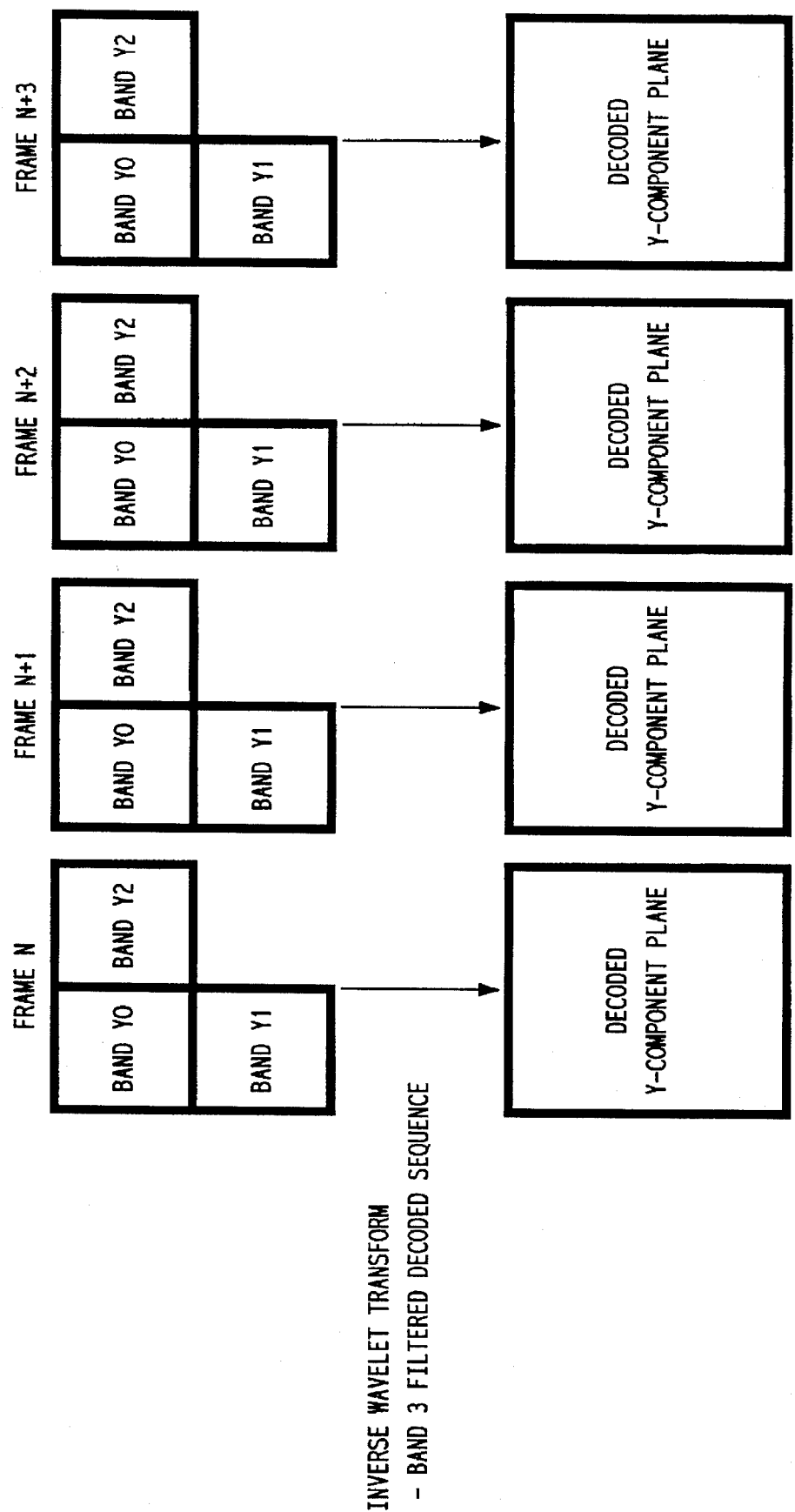
FIG. 25. CASE 2: BANDS 012 DECODE

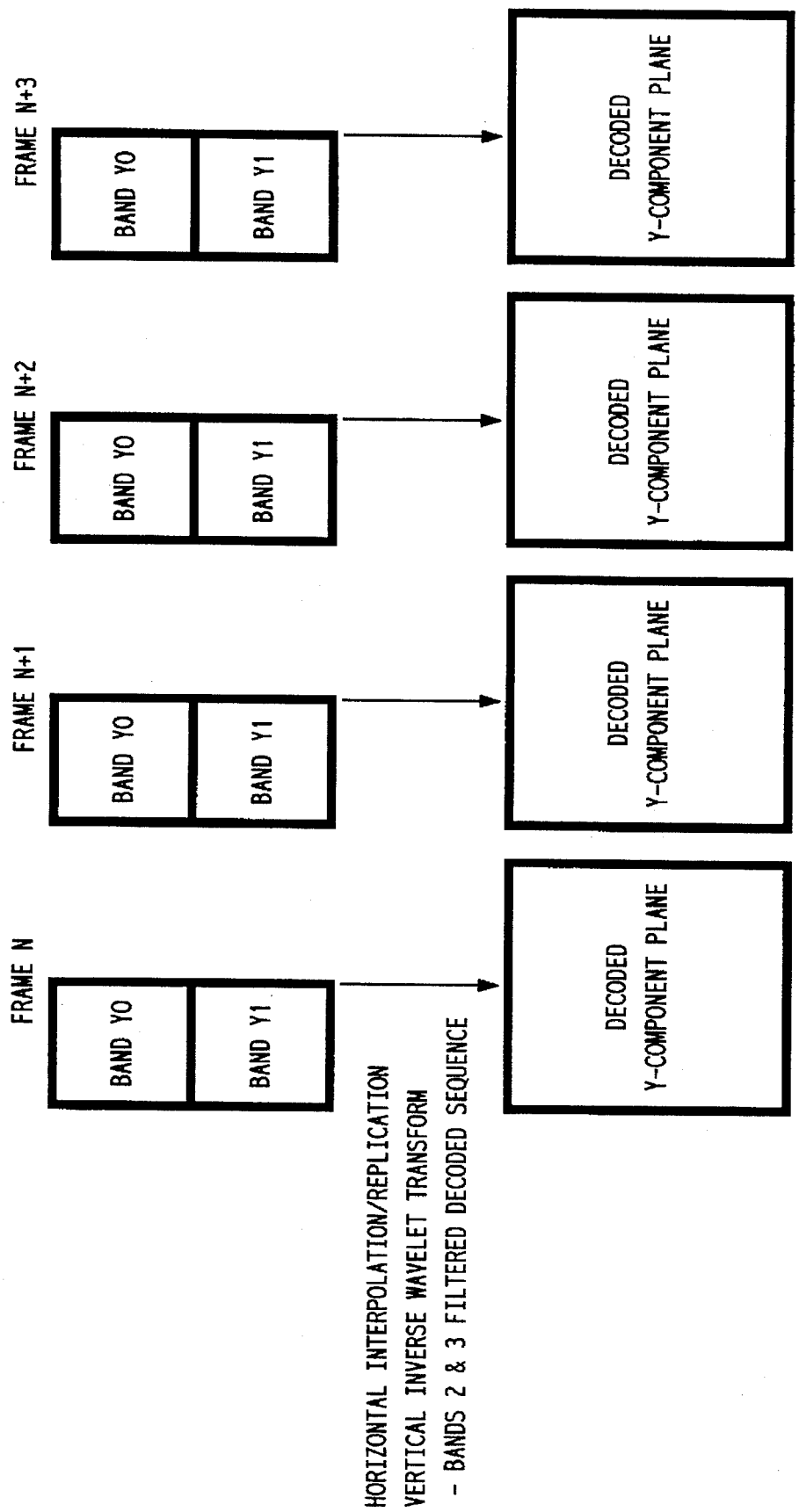
FIG. 26. CASE 3: BANDS 01 DECODE

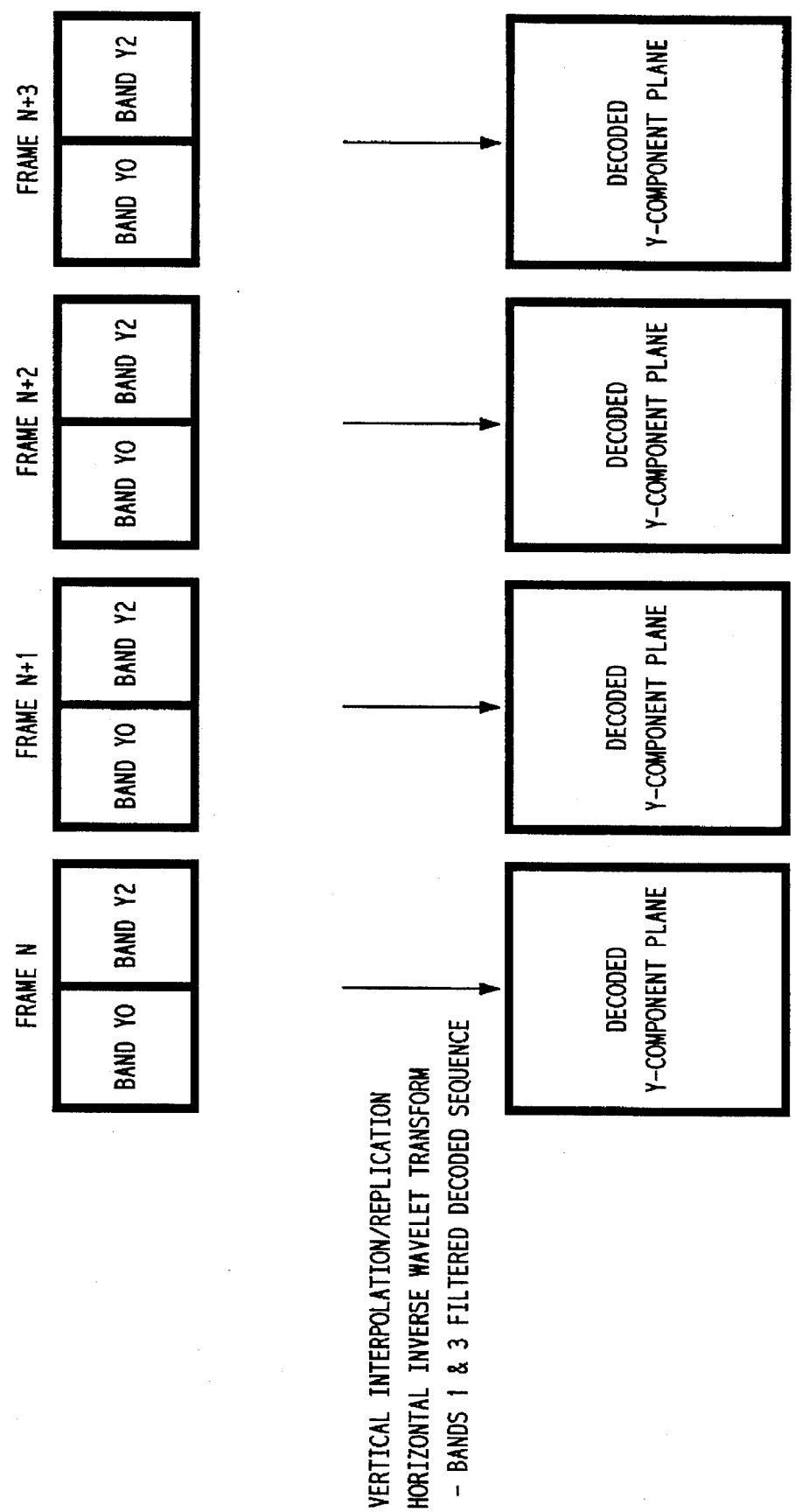
FIG. 27. CASE 4: BANDS 02 DECODE

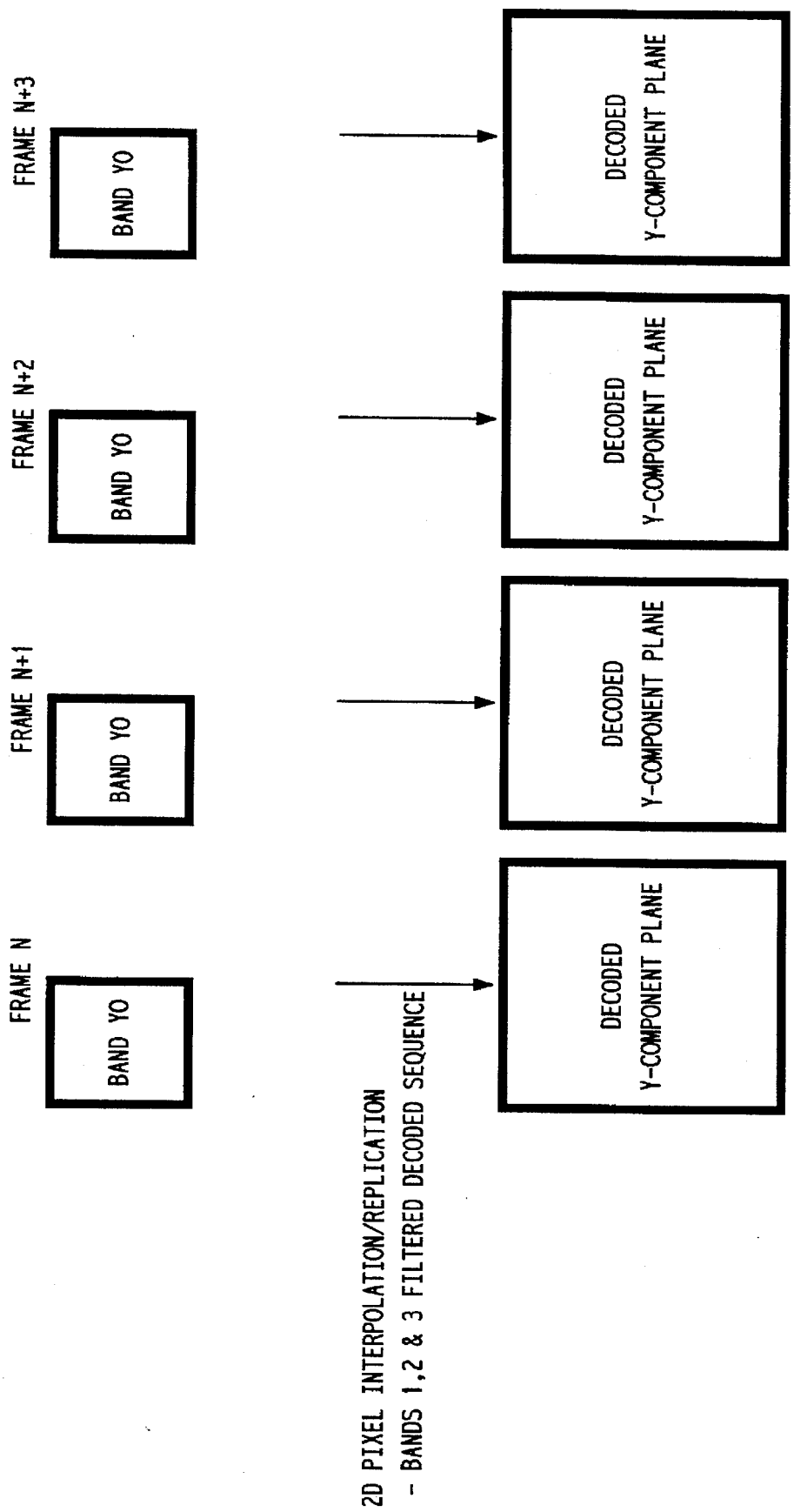
FIG. 28. CASE 5: BAND 0 ONLY DECODE

5,646,618

DECODING ONE OR MORE VARIABLE-LENGTH ENCODED SIGNALS USING A SINGLE TABLE LOOKUP

This nonprovisional U.S. national application, filed under 35 U.S.C. §111(a), claims, under 37 C.F.R. §1.78(a)(3), the benefit of the filing date of provisional U.S. national application no. 60/001369, filed on Jul. 21, 1995 under 35 U.S.C. §111(b).

BACKGROUND OF THE INVENTION

1. Field of the Invention

The present invention relates to image processing, and, in particular, to computer-implemented processes and apparatuses for encoding and/or decoding video signals for storage, transmission, and/or playback.

2. Description of the Related Art

Conventional systems for playing video in a personal computer (PC) environment are limited, in part, by the processing capabilities of the PC host processors. These limitations include low video frame rates and small video window sizes for display of video images. Such limitations result in low video quality. As a result, some conventional systems for playing video in a PC environment require additional hardware that is designed to process video data at the rates needed to provide acceptable video quality. This additional hardware adds undesirable costs to the PC system.

It is, therefore, desirable to provide a video playback system for displaying high-quality, full-motion digital video images on a graphics display monitor in a PC environment that does not require any additional hardware. Such a video playback system is preferably capable of performing decoding and display functions to support a playback mode. In playback mode, the playback video system would access an encoded video bitstream from a mass storage device or receive the encoded video bitstream from a remote source, decode the bitstream on the host processor, and display the decoded video on a display monitor.

It is also desirable to provide a video compression system for generating the encoded video bitstream that will be decoded and displayed by the video playback system. Such a video compression system is preferably capable of performing capture, encoding, decoding, and display functions to support both a compression mode and the playback mode. In compression mode, the video compression system would capture and encode video images generated by a video generator, such as a video camera, VCR, or laser disc player. The resulting encoded video bitstream would then be stored to a mass storage device, such as a hard drive or, ultimately, a CD-ROM, for future decoding, and/or transmitted to a remote playback system for real-time decoding. At the same time, the encoded video bitstream could also be decoded and displayed on a display monitor to monitor the compression-mode processing.

Most known video codec (i.e., coder/decoder) architectures are designed to generate compressed video for playback in a limited class of processing environments. If the video codec is designed for a playback system with relatively low processing capabilities (e.g., a low-end personal computer (PC) system), then decoding the compressed video on a playback system with greater processing capabilities (e.g., a high-end PC system) will not provide significant performance advantages. If, on the other hand, the video codec is designed for a high-end PC system, then the quality of the playback output is invariably degraded in order to decode the compressed video on a low-end PC system.

In many known video codecs, the only mechanism for degrading the video quality during playback is the dropping of frames. If the video codec includes interframe encoding, then, in order to allow for the dropping of frames, some of the frames may be encoded as disposable frames (i.e., those that may be dropped without affecting the decoding of subsequent frames). The inclusion of such disposable frames tends to increase the size of the compressed bitstream. In addition, dropping frames results in jerky and unnatural video motion that can be disturbing to the viewer.

It is desirable, therefore, to provide a video codec that provides playback of compressed video in a variety of processing environments in which frames are not dropped when playback is performed on low-end systems.

It is accordingly an object of this invention to overcome the disadvantages and drawbacks of the known art and to provide video playback systems for displaying high-quality, full-motion video images in PC environments.

It is a further object of this invention to provide a video compression systems for generating the encoded video bitstreams to be decoded and displayed by the playback video systems.

It is a particular object of the present invention to provide video playback systems for displaying video images under multi-media operating systems running on personal computers with general-purpose host processors.

It is a further particular object of the present invention to provide a video codec that provides playback of compressed video in a variety of processing environments in which frames are not dropped when playback is performed on low-end systems.

Further objects and advantages of this invention will become apparent from the detailed description of a preferred embodiment which follows.

SUMMARY OF THE INVENTION

The present invention comprises a computer-implemented process, apparatus, storage medium encoded with machine-readable computer program code, and machine-readable computer program code for decoding variable-length encoded (VLE) signals of an encoded bitstream. According to a preferred embodiment, a k-bit signal is selected from the encoded bitstream. A table entry is retrieved from a lookup table using the k-bit signal as an index into the lookup table. The table entry is interpreted to determine how many complete VLE signals are in the k-bit signal. At least two decoded signals are retrieved from the table entry, if the k-bit signal comprises at least two complete VLE signals. One decoded signal is retrieved from the table entry one, if the k-bit signal comprises one complete VLE signal. Special processing is performed to decode the k-bit signal, if the k-bit signal comprises no complete VLE signals.

BRIEF DESCRIPTION OF THE DRAWINGS

Other objects, features, and advantages of the present invention will become more fully apparent from the following detailed description of preferred embodiment(s), the appended claims, and the accompanying drawings in which:

FIGS. 7-9 show representations of the pixels in the current (16×16) macroblock of the current frame in the spatial domain used for motion estimation;

FIG. 15 is a representation of an example of the band scan pattern generated during the processing of FIG. 14 for a band having (4×4) coefficient blocks;

FIG. 16 is a process flow diagram of the decompression processing implemented by the decode system of FIG. 2 for each encoded frame of the encoded video bitstream;

FIG. 17 is a block diagram of a decoder that implements the decompression processing of FIG. 16;

FIG. 18 is a block diagram of the decode processing of FIG. 16 that is applied to each encoded band of each interframe-encoded frame of the encoded video bitstream;

FIG. 19 is a block diagram of the portion of the inverse quantizer of FIG. 18 that decodes the encoded bitstream to generate the Q tables used in dequantizing the quantized coefficients recovered by the run-length decoder of FIG. 18;

FIG. 20 is a flow diagram of the processing implemented by the Huffman decoder of FIG. 18;

FIG. 21 is a representation of the fields of each 32-bit table entry of the $2^k$ lookup table used by the Huffman decoder of FIG. 18;

FIG. 22 is a graphical representation of a preferred forward wavelet transform applied to the Y-component plane of each video frame during the compression processing of FIG. 3;

FIG. 23 is a graphical representation of a preferred inverse wavelet transform applied to the four decoded bands of Y-component data for each video frame during the decompression processing of FIG. 16; and FIGS. 24-28 show graphical representations of five different cases of playback supported by the present invention.

DESCRIPTION OF PREFERRED EMBODIMENT(S)

The video coders and decoders of the present invention encode and/or decode video data in a variety of processing environments.

System Hardware Architectures

Figure 1:
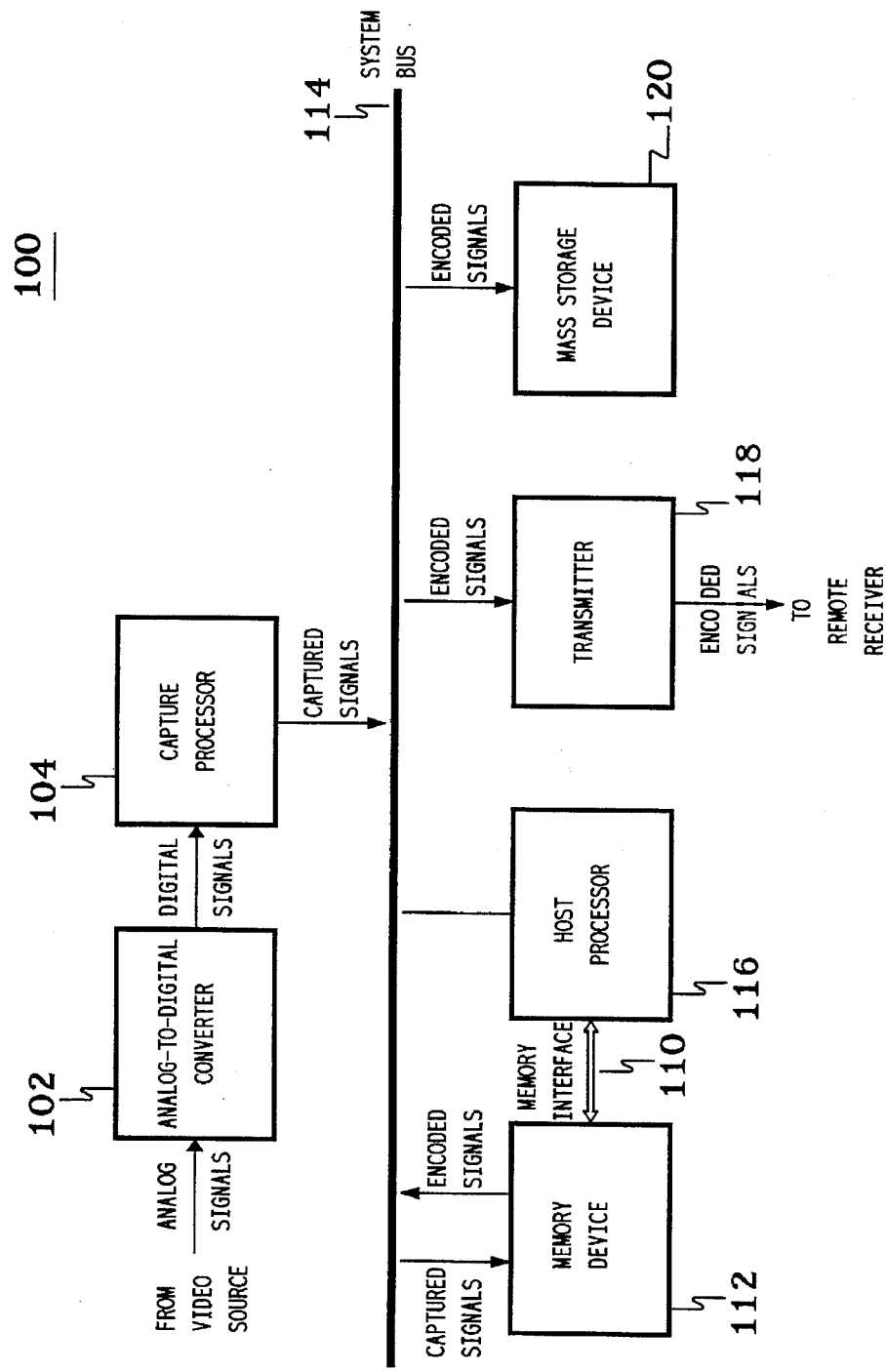
FIG. 1 is a block diagram of a video system for processing video signals in a PC environment, according to one embodiment of the present invention.

Referring now to FIG. 1, there is shown a computer system 100 for encoding video signals, according to one embodiment of the present invention. Analog-to-digital (A/D) converter 102 of encoding system 100 receives analog video signals from a video source. The video source may be any suitable source of analog video signals such as a video camera or VCR for generating local analog video signals or a video cable or antenna for receiving analog video signals from a remote source. A/D converter 102 decodes (i.e., separates the signal into constituent components) and digitizes the analog video signals into digital video component signals (e.g., in one embodiment, 8-bit R, G, and B component signals).

Capture processor 104 captures the digitized component signals received from converter 102. Capturing may include one or more of color conversion (e.g., RGB to YUV), scaling, and subsampling. Each captured video frame is represented by a set of three two-dimensional component planes, one for each component of the digitized video signals. In one embodiment, capture processor 104 captures video signals in a YUV9 (i.e., YUV 4:1:1) format, in which every (4×4) block of pixels of the Y-component plane corresponds to a single pixel in the U-component plane and a single pixel in the V-component plane. Capture processor 104 selectively stores the captured signals to memory device 112 and/or mass storage device 120 via system bus 114. Those skilled in the art will understand that, for real-time encoding, the captured signals are preferably stored to memory device 112, while for non-real-time encoding, the captured signals are preferably stored to mass storage device 120.

During real-time encoding, host processor 116 reads the captured bitmaps from memory device 112 via high-speed memory interface 110 and generates encoded video signals that represent the captured video signals. Depending upon the particular encoding scheme implemented, host processor 116 applies a sequence of compression steps to reduce the amount of data used to represent in the information in the video signals. The encoded video signals are then stored to memory device 112 via memory interface 112, and/or mass storage device 120 via system bus 114. Host processor 116 may copy the encoded video signals to mass storage device 120 and/or transmit the encoded video signals to transmitter 118 for real-time transmission to a remote receiver (not shown in FIG. 1).

Figure 2:
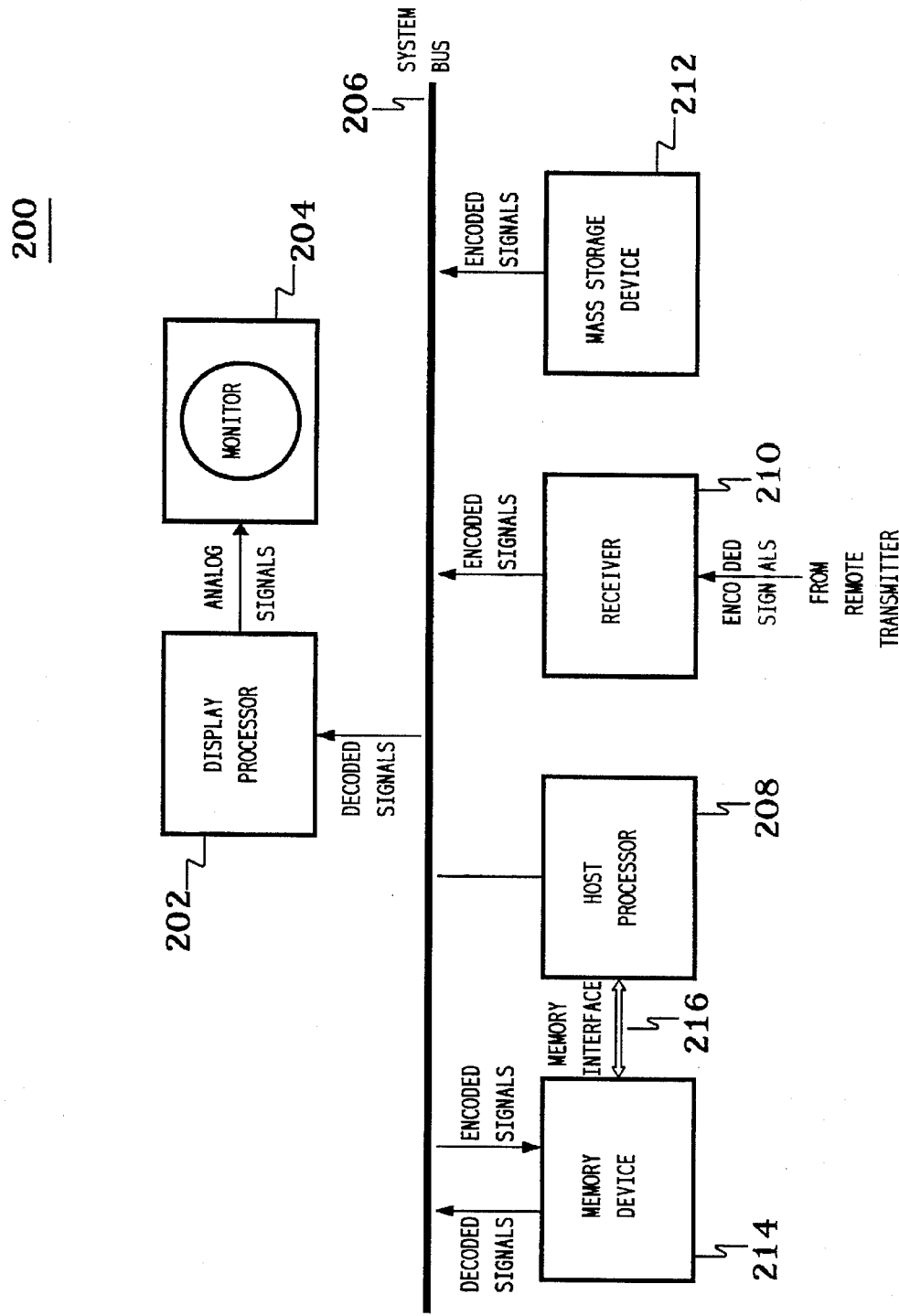
FIG. 2 is a computer system for decoding the video signals encoded by the computer system of FIG. 1, according to one embodiment of the present invention.

Referring now the FIG. 2, there is shown a computer system 200 for decoding the video signals encoded by encoding system 100 of FIG. 1, according to one embodiment of the present invention. Encoded video signals are either read from mass storage device 212 of decoding system 200 or received by receiver 210 from a remote transmitter, such as transmitter 118 of FIG. 1. The encoded video signals are stored to memory device 214 via system bus 206.

Host processor 208 accesses the encoded signals stored in memory device 214 via high-speed memory interface 216 and decodes the encoded video signals for display. Decoding the encoded video signals involves undoing the compression processing implemented by encoding system 100 of FIG. 1. Host processor 208 stores the decoded video signals to memory device 214 via memory interface 216 from where they are transmitted to display processor 202 via system bus 206. Alternatively, host processor 208 transmits the decoded video signals directly to display processor 202 via system bus 206. Display processor 202 processes the decoded video signals for display on monitor 204. The processing of display processor 202 includes digital-to-analog conversion of the decoded video signals. After being decoded by host processor 208 but before being D/A converted by display processor 202, the decoded video signals may be upsampled (e.g., from YUV9 to YUV24), scaled, and/or color converted (e.g., from YUV24 to RGB24). Depending upon the particular embodiment, each of these processing steps may be implemented by either host processor 208 or display processor 202.

Referring again to FIG. 1, encoding system 100 is preferably a microprocessor-based personal computer (PC) system with a special purpose video-processing plug-in board. In particular, A/D converter 102 may be any suitable means for decoding and digitizing analog video signals. Capture processor 104 may be any suitable processor for capturing digitized video component signals as subsampled frames. In a preferred embodiment, A/D converter 102 and capture processor 104 are contained in a single plug-in board capable of being added to a microprocessor-based PC system.

Host processor 116 may be any suitable means for controlling the operations of the special-purpose video processing board and for performing video encoding. Host processor 116 is preferably an Intel® general-purpose microprocessor such as an Intel® i486™, Pentium™, or higher processor. System bus 114 may be any suitable digital signal transfer device and is preferably a Peripheral Component Interconnect (PCI) bus. Memory device 112 may be any suitable computer memory device and is preferably one or more dynamic random access memory (DRAM) devices. High-speed memory interface 110 may be any suitable means for interfacing between memory device 112 and host processor 116. Mass storage device 120 may be any suitable means for storing digital signals and is preferably a computer hard drive. Transmitter 118 may be any suitable means for transmitting digital signals to a remote receiver. Those skilled in the art will understand that the encoded video signals may be transmitted using any suitable means of transmission such as telephone line, RF antenna, local area network, or wide area network.

Referring now to FIG. 2, decoding system 200 is preferably a microprocessor-based PC system similar to the basic PC system of encoding system 100. In particular, host processor 208 may be any suitable means for decoding encoded video signals and is preferably an Intel® general purpose microprocessor such as an Intel® i486™, Pentium™, or higher processor. System bus 206 may be any suitable digital signal transfer device and is preferably a PCI bus. Mass storage device 212 may be any suitable means for storing digital signals and is preferably a CD-ROM device. Receiver 210 may be any suitable means for receiving the digital signals transmitted by transmitter 118 of encoding system 100. Display processor 202 may be any suitable device for processing video signals for display (including converting the digital video signals to analog video signals) and is preferably implemented through a PC-based display system such as a VGA or SVGA system. Monitor 204 may be any means for displaying analog signals and is preferably a VGA monitor.

In a preferred embodiment, encoding system 100 of FIG. 1 and decoding system 200 of FIG. 2 are two distinct computer systems. In an alternative preferred embodiment of the present invention, a single computer system comprising all of the different components of systems 100 and 200 may be used to encode and decode video signals. Those skilled in the art will understand that such a combined system may be used to display decoded video signals in real-time to monitor the capture and encoding of video signals.

In alternative embodiments of present invention, the video encode processing of an encoding system and/or the video decode processing of a decoding system may be assisted by a pixel processor or other suitable component(s) to off-load processing from the host processor by performing computationally intensive operations.

Encode Processing

Figure 3:
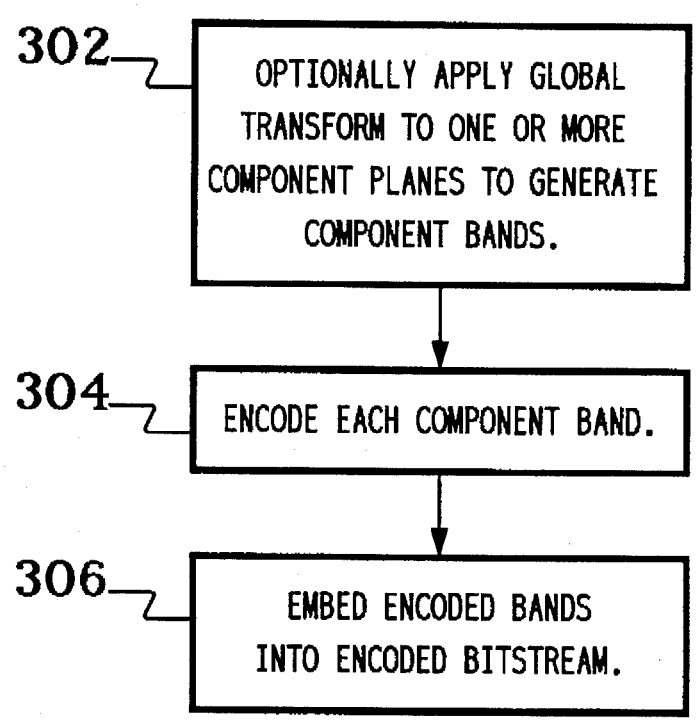
FIG. 3 is a process flow diagram of the compression processing implemented by the system of FIG. 1 for each frame of a video stream.

Referring now to FIG. 3, there is shown a process flow diagram of the compression processing implemented by encode system 100 of FIG. 1 for each frame of a video stream, according to a preferred embodiment of the present invention. The RGB24 signals generated by A/D converter 102 are converted to YVU24 signals by capture processor 104. Capture processor 104 subsamples the YVU24 signals to generate subsampled YVU9 signals. This is done by subsampling the U and V planes using the following 16-tap (4×4) 2-dimensional filter:

| { | 3, | 5, | 5, | 3. |
|---|---|---|---|---|
|   | 5, | 25, | 25, | 5, |
|   | 5, | 25, | 25, | 5, |
|   | 3, | 5, | 5, | 3 }/152 |

Eight bits of precision are maintained for the components of the YVU9 data, which are captured for each frame as a Y-component plane, a subsampled U-component plane, and a subsampled V-component plane. Capture processor 104 is also capable of generating YVU12, in which there are one U component and one V component for each (2×2) block of Y components.

Figure 4:
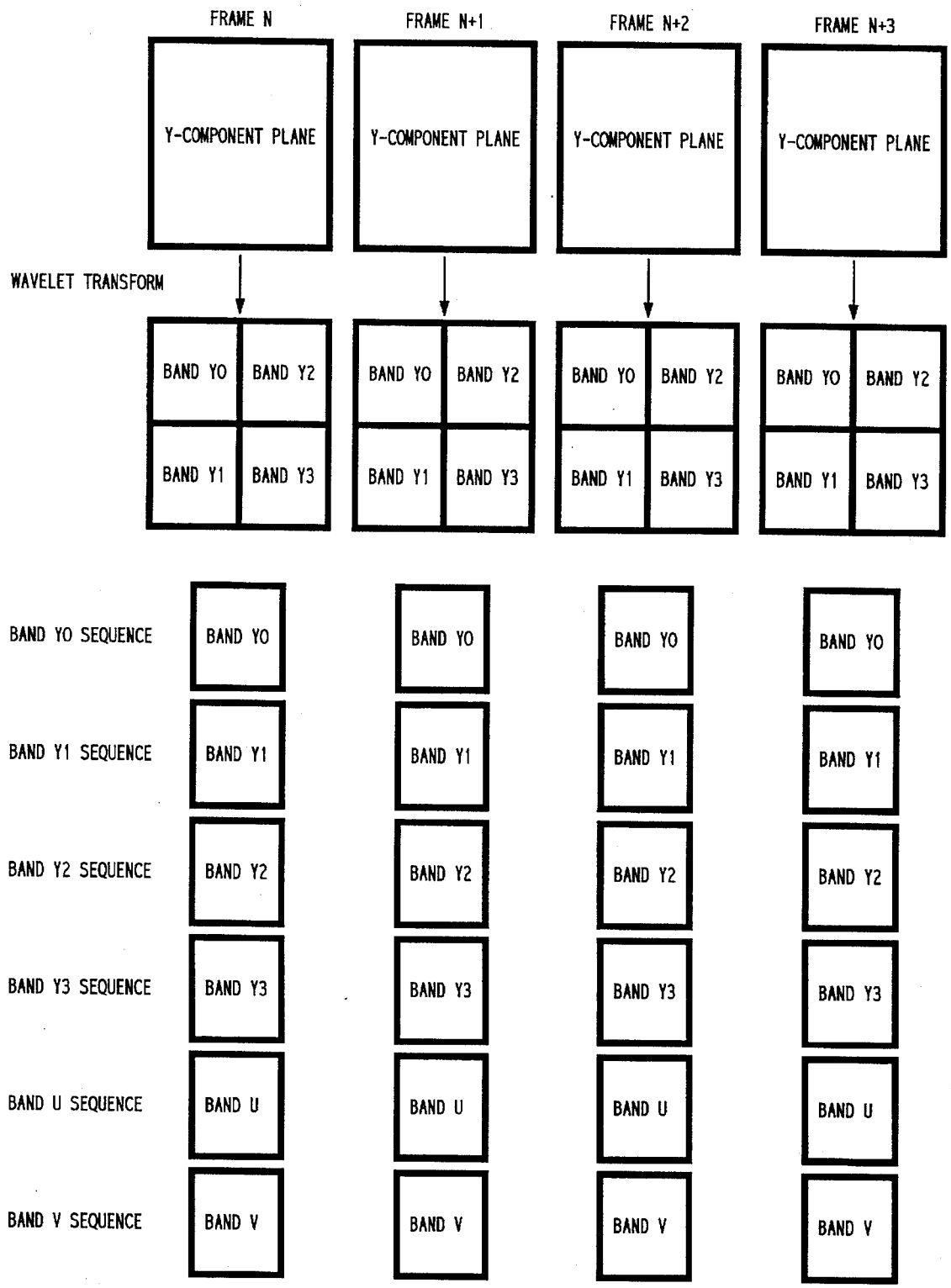
FIG. 4 shows a graphical representation of the six band sequences for the compression processing of FIG. 3.

Compression processing for each frame begins by optionally applying a global transform to one or more of the component planes to decompose the component planes into a plurality of bands (step 302 of FIG. 3). For example, a forward wavelet transform may be applied to the Y-component plane to globally decompose (i.e., transform) the Y-data into four separate bands of data, thereby producing a total of six bands of data for each frame: four Y-component bands, one U-component band, and one V-component band. FIG. 4 shows a graphical representation of the six band sequences. A preferred forward wavelet transform is described in further detail later in this specification in the section entitled "Wavelet Transform."

For purposes of this specification, the four Y-component bands are designated Band Y0, Band Y1, Band Y2, and Band Y3. The subsampled U-component plane (which is not wavelet transformed) is designated Band U, and the subsampled V-component plane (which is also not wavelet transformed) is designated Band V.

Encode processing is then applied to each of the bands of the current frame (step 304 of FIG. 3), where each band is part of a distinct band sequence (e.g., see FIG. 4). The encoded bands are then embedded into the compressed video bitstream to complete the compression processing for the current frame (step 306). Steps 302–306 of FIG. 3 are repeated for each frame of the video stream.

Figure 5:
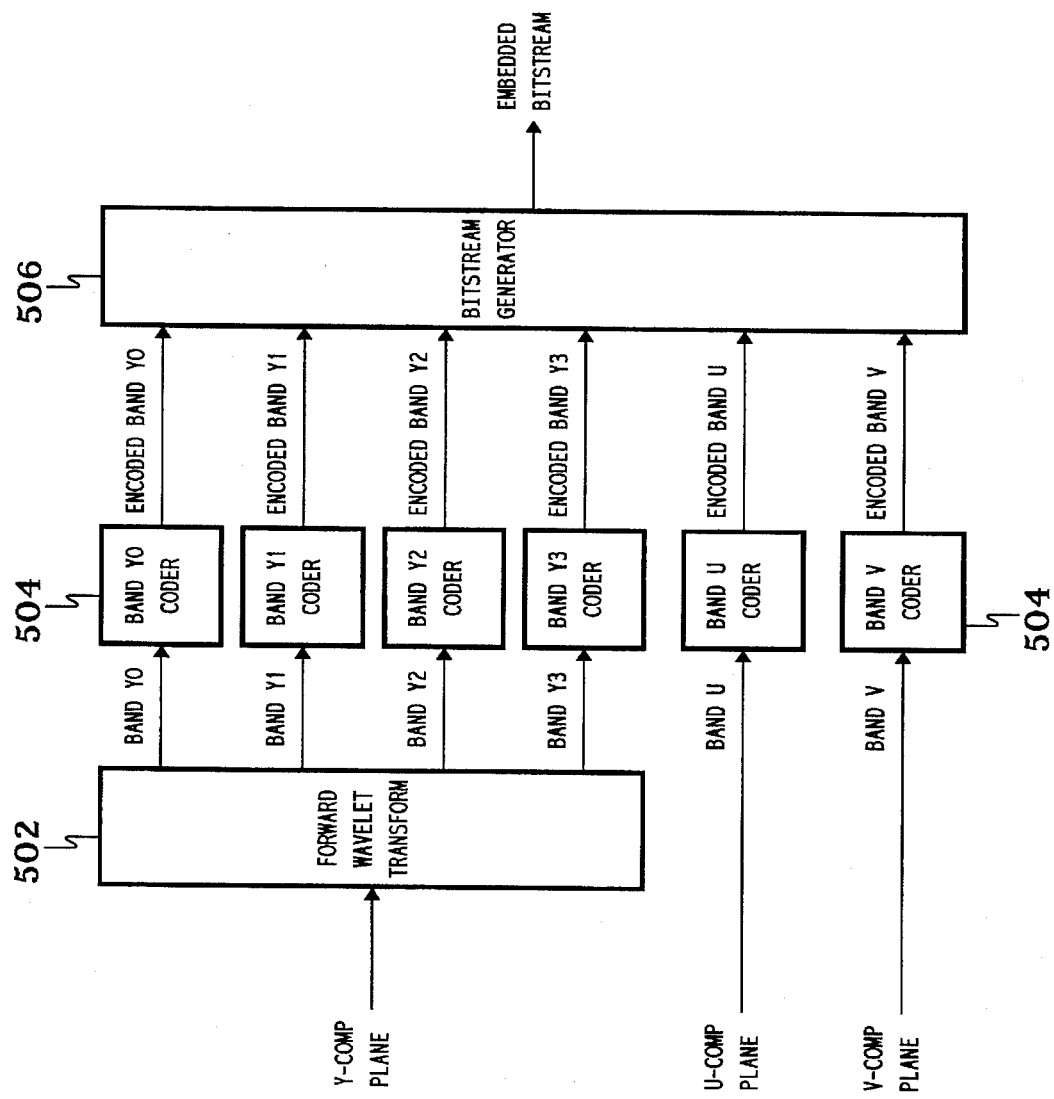
FIG. 5 is a block diagram of an encoder that implements the compression processing of FIG. 3.

Referring now to FIG. 5, there is shown a block diagram of an encoder that implements the compression processing of FIG. 3, when the forward wavelet transform is applied to only the Y-component plane. Transform 502 applies a forward wavelet transform to the Y-component plane of each frame to generate Bands Y0–Y3. Coders 504 encode the six bands of data and bitstream generator 506 embeds the resulting encoded bands into the encoded video bitstream. In a preferred embodiment, there is a single coder 504 that sequentially encodes the different bands.

Figure 6:
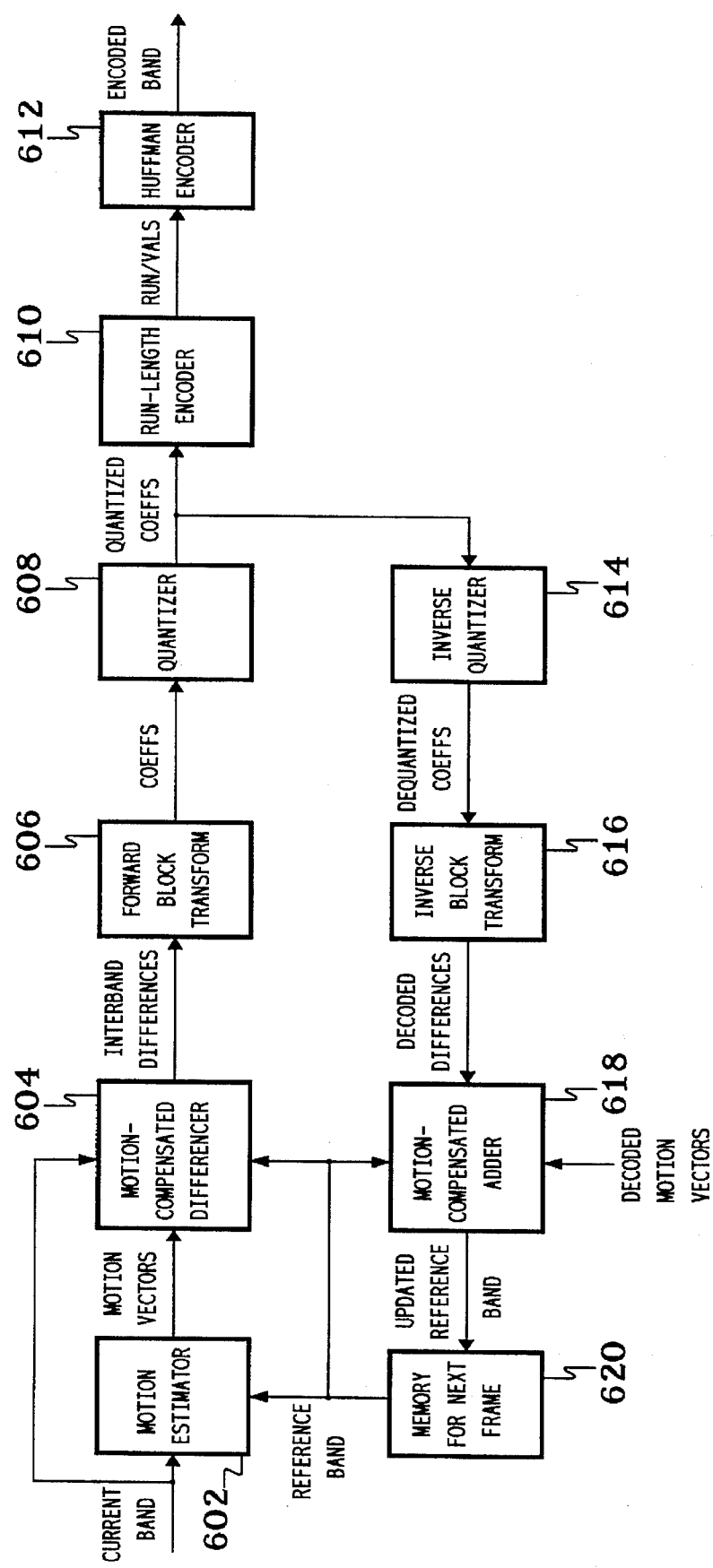
FIG. 6 is a block diagram of the encode processing of FIG. 3 which is applied to the difference blocks of each band of each inter-encoded frame of the video stream.

Referring now to FIG. 6, there is shown a block diagram of the processing of step 304 of FIG. 3 for encoding the difference blocks of each band of each inter-encoded frame of the video stream, according to one embodiment of the present invention. Those skilled in the art will understand that, in a video codec that employs interframe encoding, some of the frames are preferably encoded using only intraframe encoding. It will be further understood that each block of an inter-encoded frame may be encoded as either an intra block (i.e., using intraframe encoding) or a difference block (i.e., using interframe encoding).

In a preferred embodiment of the present invention, two different types of frames are encoded using interframe encoding (i.e., delta frames and bi-directional frames) and two different types of frames are encoded using intraframe encoding (i.e., key frames and intra frames).

A delta (D) frame is encoded with respect to a reference frame that corresponds to a previous frame. Each block of a D frame is encoded as either a difference block (i.e., using interframe encoding) or an intra block (i.e., using intraframe encoding). A bi-directional (B) frame is encoded with respect to two reference frames: a previous reference frame corresponding to a previous frame and a subsequent reference frame corresponding to a subsequent frame. Each block of a B frame is encoded as either a difference block with respect to the previous reference frame, a difference block with respect to the subsequent reference frame, or an intra block. Delta and bi-directional frames are also collectively known as predicted frames. In one embodiment, a D frame may be used to generate a reference for other frames (e.g., a subsequent B or D frame, or a previous B frame), but a B frame may not be used to generate a reference for another frame. As such, B frames are disposable frames that a decoder may skip without adversely affecting any other frames.

Key (K) frames and intra (I) frames are both encoded without reference to any other frames. As such, each block of a K or I frame is encoded as an intra block. Both K and I frames may be used as references for subsequent B or D frames. In one embodiment, the difference between K and I frames is that an I frame may be used as a reference for a previous B frame, while a K frame may not.

The selection of how to encode a sequence of frames is preferably dictated by a set of parameters that specify a K frame interval, an I frame interval, a predicted frame interval, a frame rate, and whether bi-directional prediction is enabled. An example of a possible frame sequence is as follows:

I1 B2 B3 P4 B5 B6 P7 B8 B9 P10 B11 B12 P13 B14 B15 I16

In this sequence, I1 is intra encoded; B2 and B3 are bi-directionally encoded with respect to I1 and P4; P4 is inter encoded with respect to I1; B5 and B6 are bi-directionally encoded with respect to P4 and P7; P7 is inter encoded with respect to P4; etc. This frame sequence is encoded and transmitted to the decoder in the following order:

I1 P4 B2 B3 P7 B5 B6 P10 B8 B9 P13 B11 B12 I16 B14 B15

This encoding order allows, for example, P4 to be decoded prior to B2 and B3, so that decoded P4 can be used as a reference in decoding B2 and B3. This decoding scheme introduces a one-frame latency in the decode process, because the decoded B frames are delayed by one frame during which the next I or P frame is decoded.

The encoding of intra blocks is equivalent to the encoding of difference blocks shown in FIG. 6, except that the motion estimation of 602 and motion-compensated differencing of 604 are not performed. Intra encoding is applied to all of the blocks of K and I frames as well as the intra blocks of D and B frames.

For D frames, motion estimator 602 of FIG. 6 is selectively enabled to perform motion estimation on macroblocks of the current band relative to a reference band to generate a set of motion vectors for the current band, where the D-frame reference band is generated by decoding the corresponding encoded band for a previous frame. (A block may correspond to an (8×8) set of pixels, while a macroblock may correspond to a (2×2) array of blocks (i.e., a (16×16) set of pixels).) For B frames, motion estimator 602 performs motion estimation on macroblocks of the current band with respect to two reference bands: one corresponding to a previous frame and one corresponding to a subsequent frame. When motion estimator 602 is disabled, no motion estimation is performed and zero motion vectors are used by motion-compensated differencer 604. The processing of motion estimator 602 is described in further detail later in this specification in the section entitled "Motion Estimation."

The motion vectors generated by motion estimator 602 are encoded into the compressed video bitstream. The motion vectors are preferably encoded using spatial differencing, in which each motion vector is encoded based on its difference from the previous motion vector (i.e., the adjacent motion vector following a particular scan sequence). The motion vector spatial differences are then Huffman encoded to generate the encoded motion vectors for the compressed video bitstream.

When motion vector inheritance is enabled, motion estimation is performed only on the first band of the Y-component plane (e.g., Band Y0 when the Y plane is globally decomposed using the wavelet transform). In that case, the motion vectors for the first Y band are used during motion-compensated differencing for all of the rest of the bands of the current frame. When motion vector inheritance is disabled, motion estimation is performed independently on each band of the current frame. Those skilled in the art will understand that motion vector inheritance may result in substantially faster encoding and slightly faster decoding.

Motion-compensated differencer 604 applies the appropriate motion vectors to the reference band to generate a motion-compensated reference band. Differencer 604 also generates interband differences for the current band using the motion-compensated reference band and the current band.

In a K or I frame, each block is encoded as an intra block. In a D or B frame, some of the blocks may be encoded as difference blocks, while others may be encoded as intra blocks. In general, it is desirable to encode a block using the technique that results in the lowest number of bits of encoded data. One approach would be to encode each block using both intra-encoding and inter-encoding to determine which results in the fewer number of bits. This approach may be too time consuming for many applications.

In an alternative embodiment, the results of intra-encoding and inter-encoding are estimated using an Intra Grad measure and a SAD measure, respectively. The Intra Grad measure is generated for each macroblock by (1) generating the mean of the pixels in the macroblock and (2) then generating the sum of the absolute differences between that mean and the pixels of the macroblock. The SAD measure for each macroblock is the sum of the absolute values of the motion-compensated interband differences generated by differencer 604.

For D and B frames, each block of a macroblock is designated as an intra block, if the Intra Grad measure is less than the SAD measure for that macroblock. Otherwise, the blocks of the macroblock are designated as a difference block.

The Intra Grad measure is also used to determine the quantization level for each macroblock of the current band. Each macroblock of the current band is assigned a value (QDelta) that corresponds to the deviation of the Q level (Qlevel) for the current macroblock from a global Q level (GlobalQuant). The determination of the global Q level is described in further detail later in this specification in the section entitled "Bit Rate Control." In a preferred embodiment:

$$QDelta = -8 * \log 2((Gradi + 2*MeanGrad)/(2*Gradi + MeanGrad))$$

$$if(Qlevel < 8) \ Qdelta = 0$$

where:

Gradi is the Intra Grad measure for macroblock i; and

MeanGrad is the average Intra Grad for the entire band.

A forward block transform 606 is applied to each block to generate coefficients for the current band. In a preferred embodiment, transform 606 may selectively apply any of the following transforms: a DCT transform, a slant transform, a Haar transform, or a "Slaar" transform which is a hybrid of a slant transform and a Haar transform. The selected transform may be either a one-dimensional or two-dimensional transform, and may differ from band to band. In addition, transform 606 may be disabled for any band, so that the block signals are not transformed before quantization. The processing of forward block transform 606 is described in further detail later in this specification in the sections entitled "Block Transform" and "Decode Rate Control."

Quantizer 608 quantizes the coefficients to generate quantized coefficients for the current band. Quantizer 608 applies uniform scalar quantization, wherein each coefficient is divided by a specified integer scale factor. The processing of quantizer 608 is described in further detail later in this specification in the section entitled "Adaptive Quantization."

Run-length encoder 610 transforms the quantized coefficients into run-length encoded (RLE) data. In a preferred embodiment, the RLE data for each block of quantized coefficients consist of a sequence of run/val pairs, where each run/val pair is a non-zero quantized coefficient followed by a value corresponding to a run of zero coefficients (i.e., coefficients that are quantized to zero). In a preferred embodiment, the run-length encoding follows an adaptively-generated pattern that tends to provide a long run of zero coefficients for the last run of the block. The processing of run-length encoder 610 is described in further detail later in this specification in the section entitled "Adaptive Run-Length Encoding."

Huffman encoder 612 applies Huffman-type entropy (a.k.a. statistical or variable-length) coding to the RLE data to generate the encoded data for the current band.

The encode processing of FIG. 6 also includes the decoding of the encoded band to update the reference band used in encoding the corresponding band of another video frame. Since the run-length and Huffman encoding are lossless encoding steps, the decode loop of the encode processing preferably begins at inverse quantizer 614, which dequantizes the quantized coefficients to generate dequantized coefficients for the current band. It will be understood that the decoding processing of FIG. 6 is not performed for B frames, since B frames are not used to generate references for encoding other frames.

Inverse block transform 616 applies the inverse of forward block transform 606 to the dequantized coefficients to generate decoded differences for the current band. Motion-compensated adder 618 applies decoded motion vectors (generated by decoding the encoded motion vectors for the current band) to the current reference band to generate motion-compensated reference band data. Adder 618 also performs interband addition using the motion-compensated reference band data and the decoded differences to generate an updated reference band. The updated reference band is stored in memory 620 for use as the reference band in encoding the corresponding band of another video frame.

Those skilled in the art will understand that, when decoding the quantized coefficients for intra blocks, the outputs of inverse block transform 616 are the decoded pixels for the updated reference band and motion-compensated adder 618 is disabled.

Motion Estimation

This section describes the processing of motion estimator 602 of FIG. 6. Conventional motion estimation is based on comparisons between a block of pixels of the current frame and different blocks of pixels of a reference frame. Typically, the reference blocks are limited to being which a specified search region of the reference frame (e.g., +/−31 pixels in the vertical and horizontal directions from the location in the reference frame that corresponds to the location of the current block in the current frame). Each comparison may be based on a measure of the "error" between the two blocks, such as a sum of absolute differences (SAD) or a sum of the square of differences (SSD). The reference block that yields the smallest error is typically used to generate the motion vector for the current block, where the motion vector is based on the displacement between the corresponding location of the current block in the reference frame and the selected reference block.

Conventional motion estimation is implemented in a number of ways. In an exhaustive search, the current block is compared with each possible reference block in the specified search region in a sequential pattern (e.g., raster scan order). Exhaustive searches are good at locating the best reference block in the search region, but are computationally expensive.

In a logarithm search, the current block is compared with a subset of the reference blocks in the search region (i.e., at coarse sample points). The reference block with the smallest error (call it "reference block A") is then used to select a second subset of reference blocks in the neighborhood of reference block A (i.e., at finer sample points). The reference block with the smallest error from the current subset either is used to generate the motion vector for the current block or is used to select yet another subset of reference blocks (i.e., at still finer sample points), depending upon how many levels are selected for the logarithm search.

In a step search, a first subset of reference blocks (i.e., at fine sample points) is selected in the local neighborhood of a selected center reference block. If the center reference block yields the smallest error, it is used to generate the motion vector. Otherwise, the neighboring reference block with the smallest error is selected as the new center reference block and the local search is repeated using the new center reference block.

Both logarithm and step searches can be computationally cheaper than exhaustive searches, but they can be trapped by local minima into missing the best reference block in the search region.

In a preferred embodiment of the present invention, motion estimator 602 of FIG. 6 performs motion estimation that comprises a sequence of phases. The initial phase involves the comparison of image data of low resolution in the spatial domain (i.e., subsampled blocks) at coarse sample points (i.e., low resolution in the velocity domain). Each subsequent phase uses image data with a higher spatial resolution and motion vectors at finer velocity resolution. Unlike conventional logarithm searches which retain only the single best choice for the next phase, in the system of the present invention, each successive phase is based on two or more candidates from the previous phase.

Figure 10:
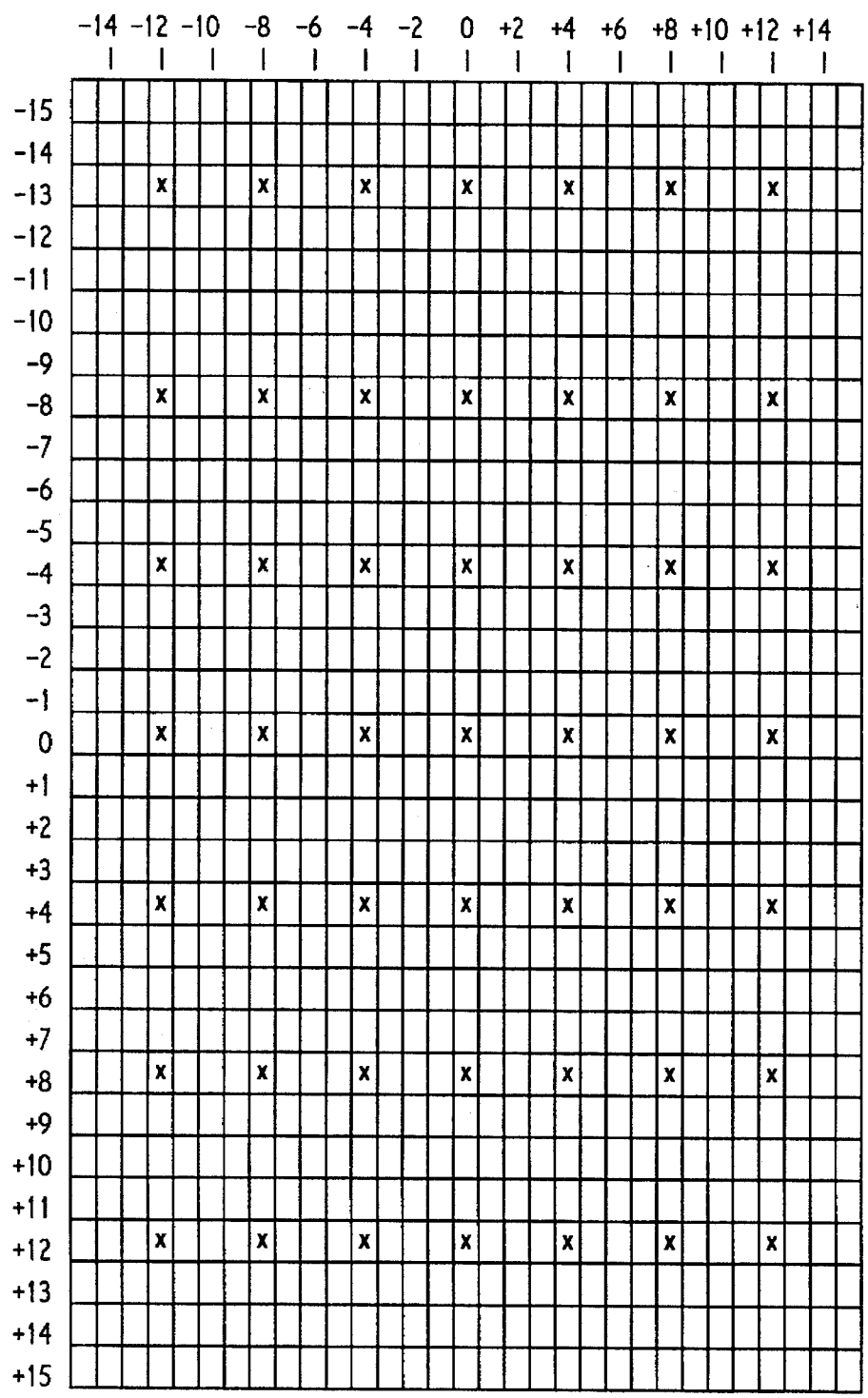
FIGS. 10-12 show representations of the full-pixel motion vectors within the search range in the velocity domain used for motion estimation.
Figure 11:
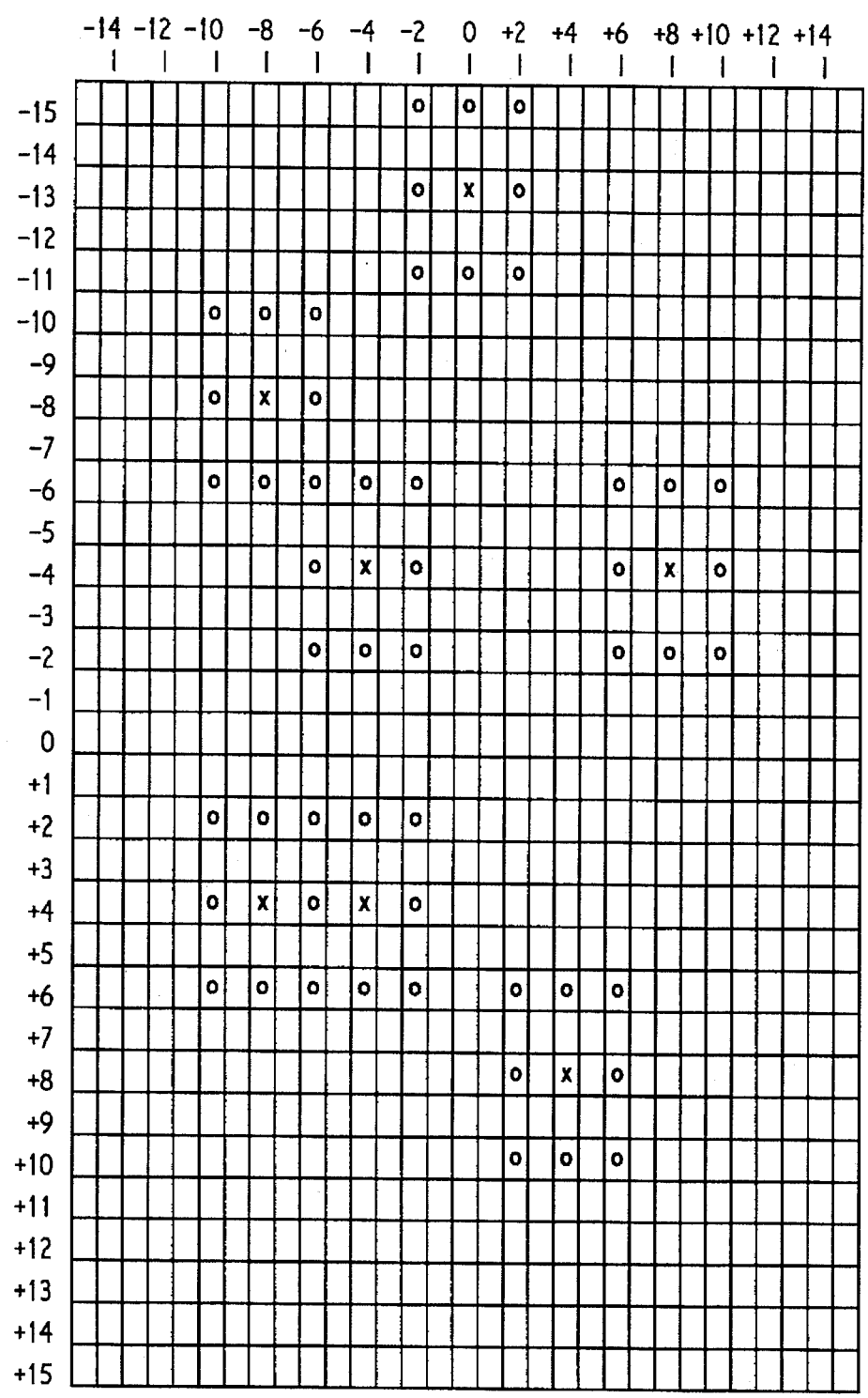
Figure 12:
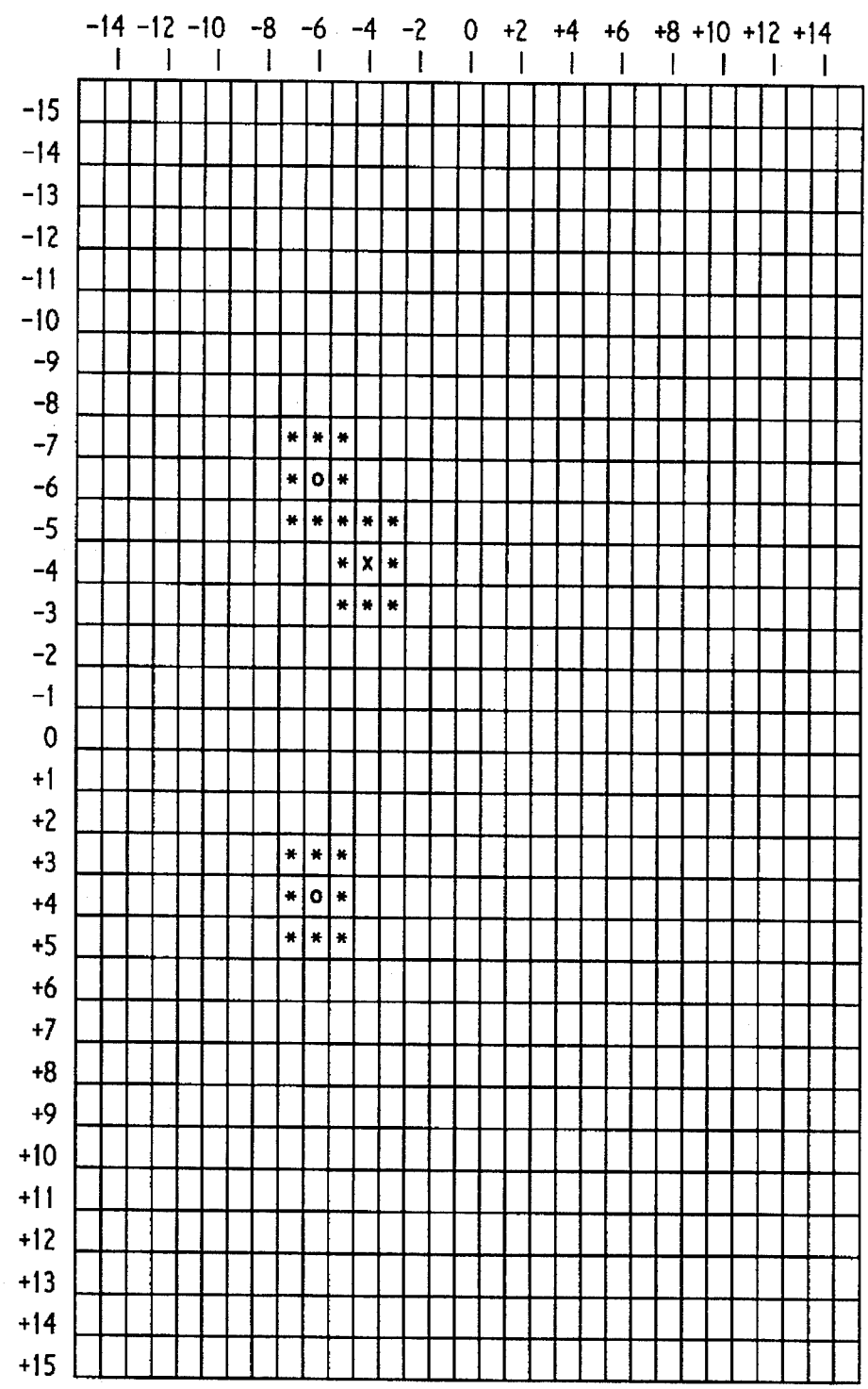

The preferred processing of motion estimator 602 is explained in further detail in the context of the example shown in FIGS. 7–12. In this example, the block size for motion estimation is a (16×16) macroblock and the search range is +/−15 pixels. FIGS. 7–9 show representations of the pixels in the current (16×16) macroblock of the current frame in the spatial domain. Each small block in FIGS. 7–9 represents a different pixel in the current macroblock. FIGS. 10–12 show representations of the full-pixel motion vectors within the search range in the velocity domain. Each small block in FIGS. 10–12 represents a different motion vector in the velocity domain. Each comparison by motion estimator 602 is preferably based on a SAD measure.

For this example, the first phase of motion estimation processing is represented in FIGS. 7 and 10. The motion vectors used in the first phase are designated by "x" in FIG. 10. In the first phase, a comparison is made between the current macroblock and the reference macroblock corresponding to each motion vector designated in FIG. 10. Rather than using the full current macroblock for each comparison, however, a subsampled current macroblock is compared to a subsampled reference macroblock. The pixels of the subsampled macroblock used in the first phase are indicated by "x" in FIG. 7. Thus, for each comparison of the first phase, a (4×4) set of current pixels is compared to a (4×4) set of reference pixels. In this example, 49 comparisons are made, corresponding to the (7×7) array of motion vectors designated in FIG. 10.

FIGS. 8 and 11 show the second phase of motion estimation processing for the present example. Rather than using only the single best match from the first phase, the second phase is based on the best n matches from the first phase (e.g., in this case, the best n=7 matches: (0,−13), (−8,−8), (−4,−4), (+8,−4), (−8,+4), (−4,+4), and (+4,+8)). These seven best matches are designated by "x" in FIG. 11. For the second phase, each of the best matches from the first phase is used to select eight new motion vectors at a finer velocity resolution than was used in the first phase. The new motion vectors are designated by "o" in FIG. 11. In FIG. 8, the pixels used for each comparison for the second are designated by an "x". Thus, for the second phase, an (8×8) set of current pixels is compared to a (8×8) set of reference pixels for each comparison. In this example, there is a comparison for each motion vector in the seven sets of motion vectors. Note that the sets of motion vectors may overlap. For example, (−6,−6) is in two different sets of motion vectors. Depending upon the sophistication of the implementation, the comparison for such shared motion vectors needs only be performed once.

FIGS. 9 and 12 show the third phase of motion estimation processing for the present example. The third phase is based on the best m matches from the second phase (e.g., in this case, the best m=3 matches: (−6,−6), (−4,−4), and (−6,+4)). These three best matches are designated by "x" or "o" in FIG. 12. Note that, in this example, one of the best matches from the second phase was also a best match from the first phase. In the third phase, each of the best matches from the second phase is used to select eight new motion vectors at a finer velocity resolution than was used in the second phase. The new motion vectors are designated by "*" in FIG. 12.

In FIG. 9, the pixels used for each comparison are designated by an "x". Thus, for each comparison of the third phase, the full (16×16) macroblock of current pixels is compared to a (16×16) macroblock of reference pixels. For the third phase, there is a comparison for each motion vector in the three sets of eight motion vectors. As in the second phase, the sets of motion vectors may overlap in the third phase. The motion vector corresponding to the best match from the third phase is selected as the motion vector for the current macroblock.

Compared to the first phase, the second phase uses image data with a higher spatial resolution and motion vectors at finer velocity resolution. Similarly, compared to the second phase, the third phase uses image data with a higher spatial resolution and motion vectors at finer velocity resolution.

Those skilled in the art will understand that motion estimation under the present invention can be accomplished with fewer SAD computations than the exhaustive search and even the logarithm and step searches. Moreover, because more than one best match is considered for each successive phase, the chances of being mislead by local minima is less than that for the logarithm and step searches.

It will also be understood that FIGS. 7–12 show one example of motion estimation according to the present invention. Other embodiments may have different numbers of phases, different block sizes, different search ranges, different resolutions in the velocity domain and in the spatial domain for the different phases, and different comparison criteria (i.e., other than SAD).

Adaptive Quantization

This section describes the processing of quantizer 608 of FIG. 6. Quantizer 608 quantizes the coefficients generated by transform 606 by dividing the coefficients by scale factors contained in a selected quantization table. In a preferred embodiment, the quantization or Q table used by quantizer 608 is selected from 64 different Q tables (32 Q tables for intra blocks and 32 Q tables for difference blocks). The 64 Q tables may be selected to be 64 default Q tables that are known to both the encoder and the decoder.

Explicit Encoding of Base and Scale Matrices

Alternatively, the 64 Q tables may be generated from four matrices that are explicitly encoded into the bitstream: an intra base matrix, an intra scale matrix, an inter base matrix, and an inter scale matrix. The 32 intra (or inter) Q tables are generated from the intra (or inter) base and scale matrices, as follows:

```
for(I=0; I<32, I++)
{
    for(j=0; j<BlockSize; j++)
    {
        for(k=0; k<BlockSize; k++)
        {
            QuantSet[i][j][k] = (BaseMatrix[j][k]
                *i* ScaleMatrix[j][k]) >> 6;
            if( QuantSet[i][j][k] > 511 )
                QuantSet[i][j][k] = 511;
            if( QuantSet[i][j][k] < 1 )
                QuantSet[i][j][k] = 1;
        }
    }
}
``` where:

BlockSize is the size of blocks of coefficients to be quantized (e.g., 8 for (8×8) blocks)

BaseMatrix is the intra (or inter) base matrix;

ScaleMatrix is the intra (or inter) scale matrix; and

QuantSet are the 32 intra (or inter) Q tables.

The 64 Q tables may be changed as frequently as every band of every frame by explicitly specifying a new set of intra and inter base and scale matrices in the bitstream. Alternatively, the Q tables for the current band may be inherited from the corresponding band of the previous frame. Since a key frame is intra encoded, a key frame may not inherit Q tables.

Prior codecs have allowed explicit specification of a base matrix in the bitstream. However, in those prior codecs, the Q tables are generated by the decoder using fixed scaling that is predetermined between the encoder and decoder. None of those prior codecs supports parameter-driven scaling based on scale factors that are explicitly encoded into the bitstream.

Generation of Base and Scale Matrices

In a preferred embodiment, the base matrix is generated by attempting to optimize two potentially uncorrelated criteria: (1) the visual quality of the decoded image and (2) the error in the image. Those skilled in the art will understand that a smaller error can result in a smaller encoded bitstream, but this may be at the expense of subjective decoded image quality.

The base matrix is preferably generated from a quantization sensitivity table (QST) and a band population table (BPT), as follows:

$$BaseMatrix = (w * QST) + ((1-w) * K/BPT)$$

where:

The QST represents the subjective visual quality criterion;

The BPT represents the objected image error criterion;

w is a weighting factor that trades off adaptivity with statistical quantization sensitivity; and K is a normalization parameter.

At one extreme, w=0 implies that only the BPT is used. In this case, statistical quantization sensitivity data is ignored and maximum adaptation to the data is achieved resulting in optimum bit allocation between bands. In this case, subjected image quality may be sacrificed. On the other extreme, w=1 implies that only the QST is used, resulting in no data dependent adaptation. A preferred value for w is w=0.3.

The scale matrix is generated using the same equation as is used to generate the base matrix, except that the weighting factor w has a different value. In a preferred embodiment, the weighting factor w is smaller for the scale matrix than for the base matrix. As such, the BPT contribution is greater for the scale matrix than for the base matrix. The scale matrix is normalized so that the average effect on bit rate and error of changing the quantization level remains about the same from level to level (i.e., the effect of changing Q table across the range of Q levels is roughly linear for bit rate and error).

The normalization parameter K is preferably generated according to:

$$K = m_{QST} * m_{BPT}$$

where:

$m_{QST}$ is the mean value of the elements of the QST table; and $m_{BPT}$ is the mean value of the elements of the BPT table. $m_{QST}$ is fixed for a given transform, while $m_{BPT}$ varies from band to band and from frame to frame.

The quantization sensitivity table (QST) is generated empirically off line for each different type of transform. The QST is based on the subjective sensitivity of the human eye to errors in each transform coefficient. The entries in the QST are the quantization levels at which the human eye begins to detect the effect of quantizing the transform coefficient in the decoded image.

A preferred procedure for generating QST table starts with the identity Q table (i.e., all scale factors are 1 and nothing is quantized). The scale factor for the first coefficient is increased until the effect of quantization is just noticeable using test images representative of images that will be processed during on-line operations. The scale factor is then decremented by one. Note that the scale factors are not limited to integer powers of two. Keeping the first coefficient at the newly selected value, the process is repeated for the second coefficient. The process is repeated for each of the rest of the coefficients keeping all of the preceding coefficients at their new values. The coefficients are selected in a scan pattern that may be unique for the particular transform.

In a preferred embodiment, the scan patterns for the coefficients of the different transforms are as follows:

o  For (8×8) slant and (8×8) DCT transforms:

| 0  | 1  | 5  | 6  | 14 | 15 | 27 | 28 |
|----|----|----|----|----|----|----|----|
| 2  | 4  | 7  | 13 | 16 | 26 | 29 | 42 |
| 3  | 8  | 12 | 17 | 25 | 30 | 41 | 43 |
| 9  | 11 | 18 | 24 | 31 | 40 | 44 | 53 |
| 10 | 19 | 23 | 32 | 39 | 45 | 52 | 54 |
| 20 | 22 | 33 | 38 | 46 | 51 | 55 | 60 |
| 21 | 34 | 37 | 47 | 50 | 56 | 59 | 61 |
| 35 | 36 | 48 | 49 | 57 | 58 | 62 | 63 | o  For the 8×8 Slaar:

| 1  | 2  | 6  | 7  | 33 | 34 | 38 | 39 |
|----|----|----|----|----|----|----|----|
| 3  | 5  | 8  | 13 | 35 | 37 | 40 | 45 |
| 4  | 9  | 12 | 14 | 36 | 41 | 44 | 46 |
| 10 | 11 | 15 | 16 | 42 | 43 | 47 | 48 |
| 17 | 18 | 22 | 23 | 49 | 50 | 54 | 55 |
| 19 | 21 | 24 | 29 | 51 | 53 | 56 | 61 |
| 20 | 25 | 28 | 30 | 52 | 57 | 60 | 62 |
| 26 | 27 | 31 | 32 | 58 | 59 | 63 | 64 | o  For (8×8) Haar transform:

| 0  | 2  | 6  | 7  | 16 | 17 | 18 | 19 |
|----|----|----|----|----|----|----|----|
| 1  | 3  | 10 | 11 | 28 | 29 | 30 | 31 |
| 4  | 8  | 24 | 25 | 40 | 41 | 42 | 43 |
| 5  | 9  | 26 | 27 | 47 | 46 | 45 | 44 |
| 12 | 20 | 32 | 33 | 48 | 49 | 50 | 51 |
| 13 | 21 | 35 | 34 | 55 | 54 | 53 | 52 |
| 14 | 22 | 36 | 37 | 56 | 57 | 58 | 59 |
| 15 | 23 | 39 | 38 | 63 | 62 | 61 | 60 | o  For all (1×8) Haar transforms:

| 0  | 1  | 2  | 3  | 4  | 5  | 6  | 7  |
|----|----|----|----|----|----|----|----|
| 8  | 9  | 10 | 11 | 12 | 13 | 14 | 15 |
| 16 | 17 | 18 | 19 | 20 | 21 | 22 | 23 |
| 24 | 25 | 26 | 27 | 28 | 29 | 30 | 31 |
| 32 | 33 | 34 | 35 | 36 | 37 | 38 | 39 |
| 40 | 41 | 42 | 43 | 44 | 45 | 46 | 47 |
| 48 | 49 | 50 | 51 | 52 | 53 | 54 | 55 |
| 56 | 57 | 58 | 59 | 60 | 61 | 62 | 63 | o  For all (8×1) transforms:

| 0 | 8  | 16 | 24 | 32 | 40 | 48 | 56 |
|---|----|----|----|----|----|----|----|
| 1 | 9  | 17 | 25 | 33 | 41 | 49 | 57 |
| 2 | 10 | 18 | 26 | 34 | 42 | 50 | 58 |
| 3 | 11 | 19 | 27 | 35 | 43 | 51 | 59 |
| 4 | 12 | 20 | 28 | 36 | 44 | 52 | 60 |
| 5 | 13 | 21 | 29 | 37 | 45 | 53 | 61 |
| 6 | 14 | 22 | 30 | 38 | 46 | 54 | 62 |
| 7 | 15 | 23 | 31 | 39 | 47 | 55 | 63 | o  For (8×8) blocks that are not transformed:

| 0  | 1  | 5  | 6  | 14 | 15 | 27 | 28 |
|----|----|----|----|----|----|----|----|
| 2  | 4  | 7  | 13 | 16 | 26 | 29 | 42 |
| 3  | 8  | 12 | 17 | 25 | 30 | 41 | 43 |
| 9  | 11 | 18 | 24 | 31 | 40 | 44 | 53 |
| 10 | 19 | 23 | 32 | 39 | 45 | 52 | 54 |
| 20 | 22 | 33 | 38 | 46 | 51 | 55 | 60 |
| 21 | 34 | 37 | 47 | 50 | 56 | 59 | 61 |
| 35 | 36 | 48 | 49 | 57 | 58 | 62 | 63 | o  For (4×4) slant and (4×4) DCT transforms:

| 0 | 1 | 5  | 6  |
|---|---|----|----|
| 2 | 4 | 7  | 12 |

```
            3   8  11  13
            9  10  14  15
    o  For the 4×4 Slaar:
            1   2   9  10
            3   4  11  12
            5   6  13  14
            7   8  15  16
    o  For (4×4) Haar transform:
            0   1   8   9
            2   3  11  10
            4   5  12  13
            7   6  14  15
    o  For all (4×1) transforms:
            0   4   8  12
            1   5   9  13
            2   6  10  14
            3   7  11  15
    o  For all (1×4) transforms:
            0   1   2   3
            4   5   6   7
            8   9  10  11
           12  13  14  15
    o  For (4×4) blocks that are not transformed:
            0   1   5   6
            2   4   7  12
            3   8  11  13
            9  10  14  15
```

The band population table (BPT) is generated for the current band by summing the magnitudes of the corresponding coefficients for all of the blocks of the band. That is, the (0,0) element of the BPT is the sum of the absolute values of the (0,0) coefficients for all of the blocks of the band.

Figure 13:
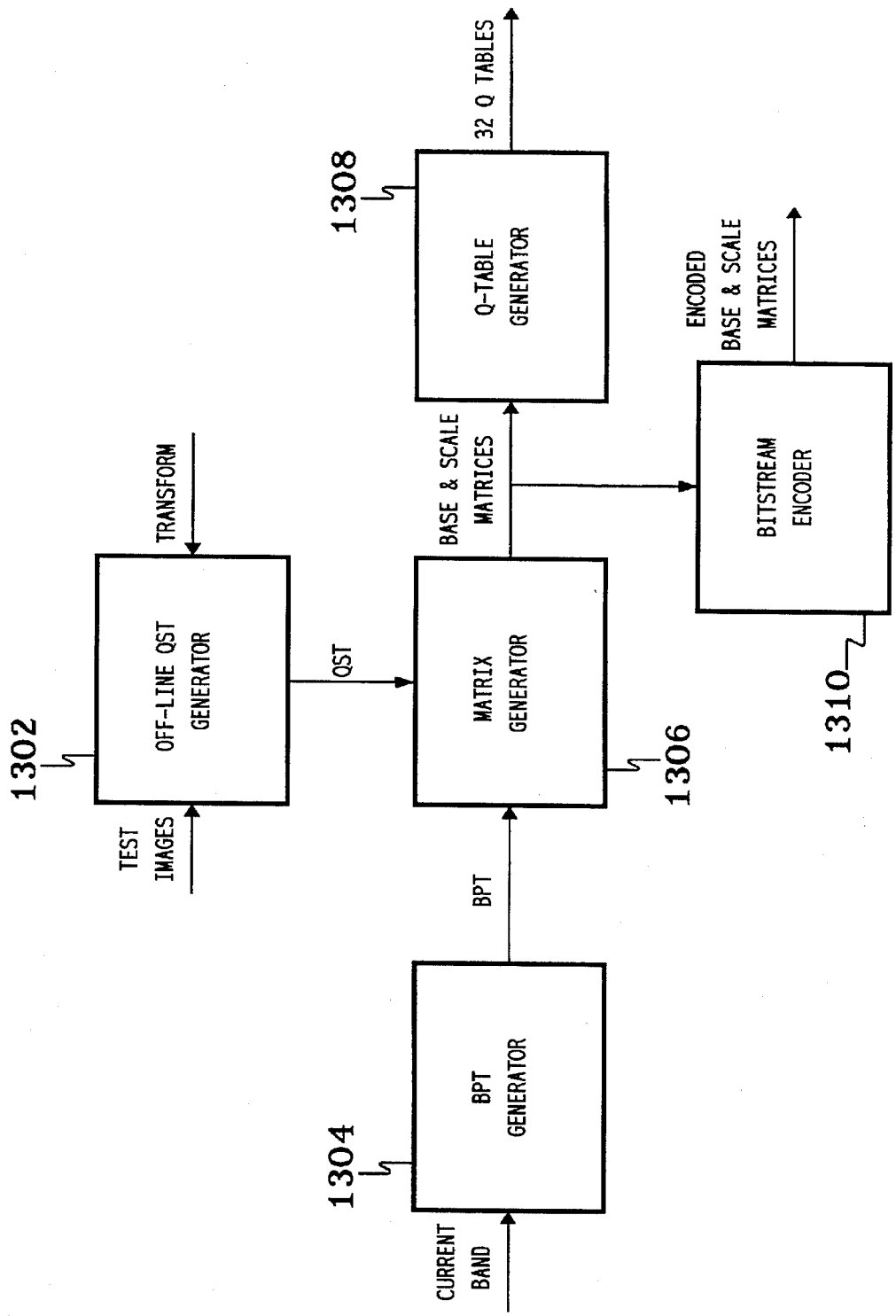
FIG. 13 is a block diagram of the portion of the quantizer of FIG. 6 that generates the Q tables used in quantizing the coefficients generated by the transform of FIG. 6.

Referring now to FIG. 13, there is shown a block diagram of the portion of quantizer 608 of FIG. 6 that generates the Q tables used in quantizing the coefficients generated by transform 606, according to a preferred embodiment of the present invention. The off-line QST generator 1302 generates the quantization sensitivity table (QST) for each transform using test images. The real-time BPT generator 1304 generates the band population table (BPT) from the coefficients of the blocks of the current band. The matrix generator 1306 generates the base and scale matrices for the current band from the QST and BPT. The Q-table generator 1308 generates the 32 quantization tables used to encode the current band from the base and scale matrices. The base and scale matrices are also explicitly encoded into the bitstream by the bitstream encoder 1310.

Those skilled in the art will understand that allowing the quantization tables to be fine tuned for each band results in better video quality at a fixed bitrate.

Bit Rate Control

Once the Q tables for the current band are generated, bit rate control is performed to determine a global quantization level for the current band. This determination is made based on the frame type and the state of a byte buffer. There are two stages in this determination. Stage 1 is executed at startup time, while Stage 2 is executed at runtime during the encoding of each frame.

Stage 1: Startup Time

The following parameters are initialized at startup time:

KByteRate—Average bit rate in KBytes per frame (input by application/user);

MaxBuffer—Maximum byte buffer size in KBytes (may be input by application/user; default value=32 KBytes);

GlobalByteBankFullness—fullness of global byte bank in KBytes (preferably initialized to 0);

RatioI—relative size of encoded intra or key frames (preferably initialized to 10);

RatioD—relative size of encoded delta frames (preferably initialized to 7);

RatioB—relative size of encoded bi-directional frames (preferably initialized to 5);

ReactPos—bit rate control parameter (preferably initialized to 32); and

ReactNeg—bit rate control parameter (preferably initialized to 128).

The bytes per frame (in KBytes) for the I, D, and B frames are generated as follows:

Denom=RatioI+RatioD+RatioB
BytesPerI=KByteRate * RatioI/Denom
BytesPerD=KByteRate * RatioD/Denom
BytesPerB=KByteRate * RatioB/Denom Stage 2: Runtime The following processing is implemented at runtime once for each frame being encoded:

```
switch( Context->FrameType )
{
case PIC_TYPE_I:
case PIC_TYPE_K:
{//for intra or key frames
    ByteDelta = MaxBuffer/2 -
        GlobalByteBankFullness;
    if( ByteDelta > 0 )
    {   //lower than half the buffer
        BytesForThisFrame = BytesPerI+
        (ByteDelta*ReactPos)/256;
    }
    else
    {   //exceeded half the buffer
        BytesForThisFrame = BytesPerI+
        (ByteDelta*ReactNeg)/256;
    }//endif
    GlobalByteBankFullness -= BytesPerI;
}//end case I or K frame
break;
case PIC_TYPE_D:
{//for delta frames
    ByteDelta = MaxBuffer/2 - GlobalByteBankFullness;
    if( ByteDelta > 0 )
    {   // lower than half the buffer
        BytesForThisFrame = BytesPerD+
        (ByteDelta*ReactPos)/256;
    }
    else
    {   //exceeded half the buffer
        BytesForThisFrame = BytesPerD+
        (ByteDelta*ReactNeg)/256;
    }
    GlobalByteBankFullness -= BytesPerD;
//end case D frame
break;
case PIC_TYPE_B:
{//for bidirectional frames
    ByteDelta = Buffer/2 - GlobalByteBankFullness;
    if( ByteDelta > 0 )
    {   //lower than half the buffer
        BytesForThisFrame = BytesPerB+
        (ByteDelta*ReactPos)/256;
    }
    else
    {   //exceeded half the buffer
        BytesForThisFrame = BytesPerB+
        (ByteDelta*ReactNeg)/256;
    }
    GlobalByteBankFullness -= BytesPerB;
}//end case B frame
break;
} /*end switch frame type*/
```

The objective of the next part of Stage 2 is to determine an appropriate global quantization level to encode this picture so as to achieve the BytesForThisFrame target. This part is executed as follows:

```
//Perform initial encode using current global Q level
Initial Encode( GlobalQuant )
//Test if the number of bytes generated during the initial encode
are less than the number of bytes allocated for this frame.
if( BytesGenerated During Initial Encode <
BytesForThisFrame )
{
    Delta = 0;
    while( BytesGenerated < BytesForThisFrame &&
    ABS(Delta) < 2 )
    {//Decrement global Q level and perform trial encode.
        GlobalQuant -= 1
        BytesGenerated = Trial Encode( GlobalQuant )
        Delta -= 1
    }
}
else
{
    Delta = 0;
    while( BytesGenerated < BytesForThisFrame &&
    ABS(Delta) <2 )
    {//Increment global Q level and perform trial encode.
        GlobalQuant += 1
        BytesGenerated = Trial encode( GlobalQuant )
        Delta += 1;
    }
}
//Perform final encode using selected global Q level.
```

Final Encode(GlobalQuant)

In the last part of Stage 2, the fullness of the global byte bank is updated as follows:

GlobalByteBandFullness—=BytesGenerated where BytesGenerated is the number of bytes generated by the final encode.

Adaptive Run-Length Encoding

This section describes the processing of run-length encoder 610 of FIG. 6. Encoder 610 applies run-length encoding to the quantized coefficients generated by quantizer 608. Those skilled in the art will understand that quantization forces many of the coefficients generated by forward block transform 606 to zero. Run-length encoding exploits the existence of coefficients that are quantized to zero by encoding the quantized coefficients as runs of coefficients that quantize to zero and values of non-zero quantized coefficients.

Conventional run-length encoding of a block of quantized coefficients follows a zig-zag pattern from the upper left corner (i.e., low-frequency coefficients) to the lower right corner (i.e., high-frequency coefficients). An special end-of-block (EOB) code may be used to indicate that the remaining coefficients in the block are all quantized to zero.

Such zig-zag run-length encoding typically provides better results when encoding quantized coefficients generated by transforming pixels than when encoding quantized coefficients generated by transforming pixel differences. For pixels, the non-zero quantized coefficients are typically concentrated towards the low-frequency terms. This is typically not the case for pixel differences, whose non-zero quantized coefficients tend to be concentrated towards the mid- and high-frequency terms. Moreover, the fixed zig-zag pattern does not take into consideration changes in the distribution of non-zero quantized coefficients from band to band and from frame to frame.

Under the present invention, the scan pattern for run-length encoding is adaptive in that it is optimized for each different set of blocks of quantized coefficients (e.g., a different scan pattern for each band of each frame). By using adaptive scan patterns, the average length of zero runs (other than the end-of-block run) are reduced, resulting in more efficient huffman encoding of the run-length encoded data.

The huffman encoding is made more efficient, because using the adaptive scan patterns reduces the number of run-val codes and reducing the entropy of the run-val codes. The scan pattern for each band is preferably explicitly encoded into the encoded video bitstream.

Figure 14:
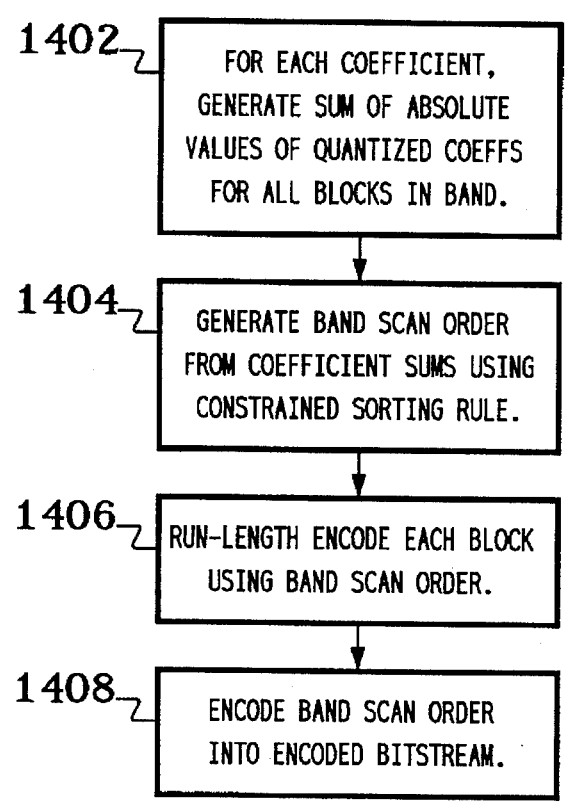
FIG. 14 is a flow diagram of the processing of the run-length encoder of FIG. 6.

Referring now to FIG. 14, there is shown a flow diagram of the processing of run-length encoder 610 of FIG. 6, according to a preferred embodiment of the present invention. Encoder 610 adaptively generates a scan pattern for each band of each frame. For each coefficient in the block of quantized coefficients, the sum of absolute values of the quantized coefficients is generated for all of the blocks in the current band (step 1402 of FIG. 14). For example, for the (0,0) coefficient, the sum of the absolute values of the quantized (0,0) coefficients for all of the blocks of the current band is generated. Step 1402 may be represented as follows:

```
for (p=0 to BlockSize)
{   for (q=0 to BlockSize)
    {   E(p,q) = 0;
        for (i=1 to N)
        {   E(p,q) += ABS ( Bi(p,q) );
        }
        E(p,q)/= N;      //Normalization step.
    }
}
``` where:

BlockSize is the size of block of quantized coefficients;

N is the number of blocks in the current band;

Bi(p,q) is the (p,q)th quantized coefficient of the ith block B, where p is the column number and q is the row number; and E(p,q) is the sum of the absolute values of the (p,q)th quantized coefficient for all N blocks.

The sum of absolute values is an example of a measure of the energy of the coefficients. Another energy measure, for example, the sum of the squares of the coefficients, may be used instead.

After generating the coefficient sums using all of the blocks of the band, the band scan order is generated using a constrained sorting rule (step 1404). According to the constrained sorting rule, the coefficients are ordered in decreasing magnitude from largest sum to smallest sum with one exception. If three or more coefficients have sums within a specified threshold of each other, then those coefficients are ordered so as to minimize the distance between subsequent scan points. The threshold value is preferably determined empirically off line by encoding sample video sequences. The ordering of the coefficients as determined by the constrained sorting rule is the scan pattern for the blocks of the current band.

Referring now to FIG. 15, there is shown a representation of an example of the band scan pattern generated during steps 1402 and 1404 of FIG. 14 for a band having (4×4) coefficient blocks. Block 1502 shows the sums for the 16 coefficients of the (4×4) blocks for the current band. The values shown in block 1502 were selected to demonstrate the constrained sorting rule and are not intended to represent realistic values accumulated for real video images.

Block 1504 shows the scan pattern that would be selected assuming strictly decreasing sums. Block 1506 shows the preferred scan pattern generated by applying the constrained sorting rule using a threshold value of 8. Since E(2,1), E(0,2), and E(2,2) are within the threshold value of one another, the exception in the constrained sorting rule applies to change the ordering of those coefficients. That is, (2,2) proceeds (0,2) in the scan pattern of block 1506, even though E(2,2) is smaller than E(0,2) in block 1502, because (2,2) has a smaller distance to (2,1). Similarly, for E(0,0), E(0,1), E(3,2), and E(2,3), and for E(2,0), E(3,1), and E(1,3).

Those skilled in the art will understand the motivation behind the constrained sorting rule. The ordering of coefficients from largest to smallest sum is based on the assumption that such a pattern tends to optimize run-length encoding for most of the blocks of the current band. If a particular block has a quantized coefficient with an unusually large magnitude (relative to the magnitudes for the same coefficient of the other blocks), then the position of that coefficient in a scan pattern based on strictly decreasing sums may yield sub-optimal results for most of the blocks of the band.

In general, coefficients that are physically close in the transform block representation represent similar frequencies and typically have similar magnitudes for typical video sequences. The constrained sorting rule helps to emphasize this characteristic and minimize the effect of those situations in which there are a few blocks with large coefficient magnitudes.

After the band scan pattern is generated in step 1404 of FIG. 14, each block of the current band is run-length encoded using that band scan pattern (step 1406). In order to enable a decoder to decode the run-length encoded signals, the band scan pattern is explicitly encoded into the encoded bitstream (step 1408). Although the explicit encoding of a different scan pattern for each band of each frame adds bits to the encoded bitstream (that are not including under conventional video encoding schemes), it has been found that the bitrate savings due to the use of adaptive scan patterns (instead of the conventional zig-zag scan pattern) is greater than the additional bitrate caused by explicitly encoding the scan pattern into the bitstream.

Those skilled in the art will understand that the constrained sorting rule can be used to generate a scan pattern for run-length encoding video signals, even when the scan pattern is not explicitly encoded into the encoded bitstream. For example, the scan pattern could be generated off-line using sample video sequences. The encoder and decoder could then be programmed to use the generated scan pattern without having the scan pattern explicitly encoded into the bitstream. In this case, the scan pattern would not change from band to band and from frame to frame.

Real-Time Encoding

In order to achieve real-time encoding using encoding system 100 of FIG. 1, the average processing time per frame may need to be reduced. This can be accomplished using the flexibility of the codec of the present invention to select an appropriate encoding scheme. The following features may be selected to accelerate encode processing.

Motion estimation can be selected to be performed only on the first band of Y-component data (e.g., Band Y0 when the Y plane is decomposed using the wavelet transform). The motion vectors for Band Y0 are then inherited for use in encoding all of the other bands.

The range of motion estimation and the maximum number of search points used can be constrained. For example, a 25-point subsampled log search yielding a search range of +/−7 may be used. In addition, half-pixel motion estimation can be disabled. On B frames, the search range can be limited to the same total number of search points as in D frames, where B-frame motion estimation is performed using two reference frames.

The block-encoding decisions can be made for Band Y0 and then these decisions can be inherited for encoding the other bands. These decisions include block type (i.e., intra or difference) as well as quantization level.

Bi-directional encoding can be disabled. In that case, only intra frames and delta frames are used.

Faster transforms (or even no transform) can be used for different bands.

If there is sufficient transmission bandwidth, motion estimation and therefore motion compensation can be disabled for all bands.

Decode Processing

Referring now to FIG. 16, there is shown a process flow diagram of the decompression processing implemented by decode system 200 of FIG. 2 for each encoded frame of the encoded video bitstream, according to a preferred embodiment of the present invention. For each encoded frame of the encoded video bitstream, decode processing is applied to each of the encoded bands (step 1602 of FIG. 16). In the case where the Y-component plane was decomposed into four bands during encoding, an inverse transform is applied to the four decoded Y-component bands to generate the decoded Y-component plane (step 1604). The decoded Y-component plane data are then processed with the decoded U- and V-component plane data to generate a decoded video image for display. A preferred inverse transform is described in further detail later in this specification in the section entitled "Wavelet Transform."

Referring now to FIG. 17, there is shown a block diagram of a decoder that implements the decompression processing of FIG. 16. Bitstream parser 1702 parses the embedded bitstream into the encoded band sequences. Decoders 1704 decode the bands of encoded data for each frame and inverse wavelet transform 1706 applies the preferred inverse wavelet transform to the decoded Y-component bands to generate the decoded Y-component plane. In a preferred embodiment, there is a single decoder 1704 that sequentially decodes the different encoded bands.

Referring now to FIG. 18, there is shown a block diagram of the decode processing of step 1602 of FIG. 16 that is applied to the difference blocks of each encoded band of each inter-encoded frame of the encoded video bitstream, according to one embodiment of the present invention. The decode processing of FIG. 18 reverses the encode processing of FIG. 6. In particular, Huffman decoder 1802 applies statistical decoding to the encoded data for the current band to reconstruct the run-length encoded run/val data. The processing of Huffman decoder 1802 is described in further detail later in this specification in the section entitled "Statistical Decoding."

Run-length decoder 1804 transforms the RLE data into quantized coefficients. Inverse quantizer 1806 dequantizes the quantized coefficients to generate dequantized coefficients. Inverse block transform 1808 applies the inverse of forward block transform 606 of FIG. 6 to the dequantized coefficients to generate decoded differences.

Referring now to FIG. 19, there is shown a block diagram of the portion of inverse quantizer 1806 of FIG. 18 that decodes the encoded bitstream to generate the Q tables used in dequantizing the quantized coefficients recovered by run-length decoder 1804, according to a preferred embodiment of the present invention. Bitstream decoder 1902 recovers the base and scale matrices from the encoded bitstream, and Q-table generator 1004 uses those base and scale matrices to generate the Q tables. The processing of generator 1904 is identical to that of Q-table generator 1308 of FIG. 13, which is described in further detail earlier in this specification in the section entitled "Generation of Base and Scale Matrices."

Referring again to FIG. 18, motion-compensated adder 1810 applies the decoded motion vectors to the reference band to generate motion-compensated reference band data, and performs inter-band addition using the motion-compensated reference band data and the decoded differences to generate the decoded data for the current band. The decoded band is then stored in memory 1812 for use as the reference band for decoding the corresponding band of another video frame. If the decoded band corresponds to a Y-component band, the decoded band is also used to reconstruct the decoded Y-component plane (step 1604 of FIG. 16). Otherwise, the decoded band is either the decoded U- or V-component plane. In any case, the decoded band is used to generate the decoded image for display.

The decoding for intra blocks is equivalent to the decoding for difference blocks shown in FIG. 18, except that the motion-compensated adding of 1810 is not performed. In that case, the outputs of inverse block transform 1808 are the decoded pixels for the updated reference band. Intra decoding is applied to all of the blocks of K and I frames as well as the intra blocks of D and B frames.

Statistical Decoding

This section describes the statistical decoding performed by Huffman decoder 1802 of FIG. 18. Huffman decoder 1802 decodes the variable-length-encoded (VLE) signals in the encoded bitstream. One conventional method for decoding VLE signals is to read the encoded bitstream into a buffer one bit at a time and test the buffer after reading each bit to determine whether the buffer contains a complete code that can be decoded or whether another bit needs to be read. Such a method can be too slow for certain applications, such as real-time decoding of encoded video images.

Referring now to FIG. 20, there is shown a flow diagram of the processing implemented by Huffman decoder 1802 of FIG. 18, according to a preferred embodiment of the present invention. Huffman decoder 1802 decodes VLE signals by considering k bits of the bitstream at a time. If N is the number of bits in the shortest code, then k≧N. In a preferred embodiment, N varies during run time and k is 10.

Those skilled in the art will understand that, if the first bit of the next k bits in the bitstream corresponds to the beginning of the next VLE code in the bitstream, then the leading bits of those k bits may correspond to one or more complete VLE codes with zero, one, or more trailing bits corresponding to an incomplete VLE code. For example, when k is 10, the first 4 bits may correspond to a first complete VLE code, the next 2 bits may correspond to a second complete VLE code, and the last 4 bits may correspond to the first 4 bits of a 10-bit VLE code. Alternatively, in the case where the next VLE code is longer than k bits, the next k bits in the bitstream correspond to an incomplete VLE code (that requires more bits from the bitstream to complete).

The present invention is designed to decode VLE codes quickly using efficient table lookups to handle those cases in which the next k bits contain one or more complete VLE codes, while applying special handling to other cases (e.g., those in which the next k bits contain a partial VLE code or where the VLE code is to be processed in a special way). An example of a VLE code that may need special processing is an "End of Data" code which may indicate the need to exit from the data decoding processing loop.

At the start of the basic processing loop, the next k bits are read from the bitstream based on the current value of a bitstream pointer (step 2002 of FIG. 20). The k bits are then used as an index to a lookup table to retrieve a table entry from the lookup table (step 2004). The lookup table has a table entry for each possible k-bit value. Each table entry indicates whether there are any complete VLE codes at the start of the k bits and, if so, the table entry also indicates the decoded values for one, two, or three VLE codes. The table entry also indicates the total number of bits used to encode the one, two, or three VLE codes.

Referring now to FIG. 21, there is shown a representation of the fields of each 32-bit table entry of the $2^k$ lookup table, according to a preferred embodiment of the present invention. Each table entry contains the decoded values for up to three different VLE codes that may be contained in the next k bits of the bitstream.

| | |
|---|---|
| TB (bits 0–3) | Represents the number of bits of the k bits that are decoded by the current table entry (i.e., the number of bits in the k-bit signal that correspond to the complete VLE signals). This value is used to update the bitstream pointer. |
| NC (bits 4–5) | Represents the number of VLE codes that are decoded by the current table entry (i.e., the number of the complete VLE signals in the k-bit signal). |
| PS (bits 6–7) | Indicates the position of a special VLE code (e.g., an end-of-block (EOB) code), if one is present in the current table entry. |
| C1 (bits 8–15) | Represents the decoded value for the first complete VLE code in the k bits, if a first complete VLE code is present. |
| C2 (bits 16–23) | Represents the decoded value for the second complete VLE code in the k bits, if a second complete VLE code is present. |
| C3 (bits 24–31) | Represents the decoded value for the third complete VLE code in the k bits, if a third complete VLE code is present. |

Alternatively, one or more of C1, C2, and C3 could represent values used in processing special codes. The remaining steps of FIG. 20 indicate how the table entry retrieved in step 2004 is interpreted and processed.

Specifically, if TB is 0 (step 2006), then the current k bits need to handled using special processing (step 2008). TB will be 0, for example, when the current k bits are the first k bits of a VLE code that is more than k bits long. This situation can occur when the longest VLE code is longer than k bits. In such a situation, special processing is preferably implemented to decode the long VLE code. This special processing may involve retrieving a number of bits equal to the longest possible VLE code, using those bits as an index into a lookup table that maps to two values: a decoded value and the length of the VLE code that corresponds to that value (used to update the bitstream pointer). Other situations requiring special processing are also possible.

After step 2008, processing returns to step 2002 to read and process the next k bits in the bitstream. However many bits are processed during the special processing of step 2008, the bitstream pointer is updated to point to the beginning of the next VLE code in the bitstream when processing returns to step 2002.

Those skilled in the art will understand that, if the VLE codebook is selected properly, then longer VLE codes will occur more infrequently in the bitstream than shorter VLE codes. As a result, handling of such cases using the special processing of step 2008 will occur infrequently. In addition, the selection of the number of bits k considered at a time for a codebook with a maximum code length N may affect the frequency with which special processing is required. If, for example k is selected to be equal to N, then all VLE codes will be able to be decoded using routine table lookups, and special processing will be required only for special cases such as EOB and other Escape situations.

If TB is not 0 (step 2006), then the current k bits contain one, two, or three complete VLE codes and processing continues to step 2010. If PS is 0 (step 2010), then none of the complete VLE codes in the current k bits are special VLE codes (e.g., the EOB code) and processing continues to step 2012. If NC is 1 (step 2012), then the current k bits contain one complete VLE code and C1 contains the decoded value for that VLE code. The one VLE code is decoded by reading out C1 to the decoded bitstream (step 2014). After step 2014, processing continues with the updating of the bitstream pointer based on the value of TB (step 2022), where TB represents the number of bits of the k bits that are decoded by the current table entry.

If NC is not 1 (step 2012), but is 2 (step 2016), then the current k bits contain two complete VLE codes, and C1 and C2 contain the decoded values for those two VLE codes. In that case, the two VLE codes are decoded by reading out C1 and C2 to the decoded bitstream (step 2018). If NC is not 2 (step 2016), then the current k bits contain three complete VLE codes, and C1, C2, and C3 contain the decoded values for those three VLE codes. In that case, the three VLE codes are decoded by reading out C1, C2, and C3 to the decoded bitstream (step 2020). As in step 2014, following either of steps 2018 or 2020, processing continues to step 2022 where the bitstream pointer is updated per TB.

If PS is not 0 (step 2010), then one of the VLE codes corresponds to a special code (e.g., the EOB code) and processing continues to step 2024. If PS is 1 (step 2024), then the first complete VLE code in the current k bits is the EOB code, which is read out to the decoded bitstream (step 2026). If PS is not 1 (step 2024), but is 2 (step 2028), then the first complete VLE code in the current k bits is not the EOB code, but the second complete VLE code in the current k bits is the EOB code. In that case, the first VLE code is decoded by reading out C1 to the decoded bitstream, and then the EOB code is read out for the second complete VLE code (step 2030). If PS is not 2 (step 2028), then neither of the first two complete VLE codes in the current k bits is the EOB code, but the third complete VLE code in the current k bits is the EOB code. In that case, the first two VLE codes are decoded by reading out C1 and C2 to the decoded bitstream, and then the EOB code is read out for the third complete VLE code (step 2032). In a preferred encoding scheme, the EOB code indicates that the remaining coefficients in the current block are all zero. In a preferred decoding scheme, after two blocks worth of data are variable-length decoded, the data for those two blocks are fully decoded (including inverse transformation and motion compensation) before more VLE codes (corresponding to other blocks) are decoded. Blocks are variable-length decoded two at a time to take advantage of pseudo-SIMD processing in subsequent decoding steps (e.g., pseudo-SIMD inverse transform).

Following any of steps 2026, 2030, or 2032, processing continues to step 2022 to update the bitstream pointer per TB. Following the updating of the bitstream pointer of step 2022, processing returns to step 2002 to process the next k bits of the bitstream. The processing of FIG. 20 is repeated until all of the current sequence of VLE codes in the bitstream are decoded.

Those skilled in the art will understand that the present invention provides fast decoding of VLE codes in an encoded bitstream by decoding the most frequently occurring codes (i.e., the shorter codes) using efficient table lookups that decode one, two, or three VLE codes with every table entry. Decoding under the present invention is typically faster than other decoding schemes that decode only a single VLE code per table lookup. Since updating the bitstream pointer and reading the next k bits from the bitstream are relatively slow operations, decoding (on the average) more than one VLE code per table lookup amortizes the processing overhead for these operations over multiple VLE codes resulting in faster implementation.

The least frequently occurring codes (i.e., the longer codes) are decoded using special processing that is implemented relatively infrequently.

An advantage of the present invention is that it is configurable at run time. That is, the lookup table can be generated at run time for any specified N-bit VLE codebook and any specified value k, wherein k is greater than or equal to the length of the shortest VLE code in the codebook. In addition, the minimum and maximum numbers of VLE codes that are decoded per table lookup can also be selected. These parameters which dictate the configuration of the lookup table are preferably explicitly encoded in the bitstream received by the decoder. The parameters are also allowed to change during run time, causing the decoder to generate a new lookup table in real time. For example, the designation of which codebook of a predefined set of codebooks to use may be explicitly encoded in the bitstream. Alternatively or in addition, a new codebook (not previously known to the decoder) may be explicitly encoded in the bitstream.

In a cache-efficient embodiment of the present invention, the value of k is chosen based on the size of the data cache on the CPU. The value of k can also be used to tailor the branch behavior to match what the CPU performs well on (minimizing branches). In a preferred embodiment, k is 10. With k=10, the lookup table fits within the unified cache of an Intel® 486™ processor and does not exceed one half of the size of the data cache of the Intel® Pentium™ processor. If the average VLE code size is 5 bits, using k=10 provides an average of two VLE codes decoded per table lookup.

Those skilled in the art will understand that the present invention can be used to decode VLE codes other than those corresponding to video signals. For example, computer data files representing text or other information can be compressed using variable-length encoding and decoded using the present invention.

Wavelet Transform

Referring now to FIG. 22, there is shown a graphical representation of a preferred forward wavelet transform applied to the Y-component plane of each video frame during compression processing (step 302 of FIG. 3). This forward wavelet transform is defined by the following equations:

$$b0=(p0+p1)+(p2+p3)$$
$$b1=(p0+p1)-(p2+p3)$$
$$b2=(p0-p1)+(p2-p3) \quad (1)$$
$$b3=(p0-p1)-(p2-p3)$$

where p0, p1, p2, p3 are Y-component values of the original Y-component plane and b0, b1, b2, b3 are the transformed values for the four bands of transformed Y-component data. In a preferred embodiment, the component values have 8 bits of precision, while the transformed values have 10 bits of precision.

Referring now to FIG. 23, there is shown a graphical representation of a preferred inverse wavelet transform applied to the four decoded bands of Y-component data for each video frame during decompression processing (step 1604 of FIG. 16). This inverse wavelet transform is defined by the following equations:

$$p0 = [(b0+b1)+(b2+b3)+2] >> 2$$
$$p1 = [(b0+b1)-(b2+b3)+2] >> 2$$
$$p2 = [(b0-b1)+(b2-b3)+2] >> 2 \qquad (2)$$
$$p3 = [(b0-b1)-(b2-b3)+2] >> 2$$

where b0, b1, b2, b3 are decoded Y-component band data and p0, p1, p2, p3 are the components of the decoded Y-component plane. The function ">>2" means "shift right two bits" and is equivalent to dividing a binary value by 4.

Video Playback Scalability

For purposes of this application, the phrase "independent of" is defined as follows. A first band sequence is said to be interframe encoded "independent of" a second band sequence, if the reference band used for interframe encoding of the first band sequence is not affected by the decoding of the encoded second band sequence. Similarly, an encoded first band sequence is said to be interframe decoded "independent of" an encoded second band sequence, if the reference band used for interframe decoding of the encoded first band sequence is not affected by the decoding of the encoded second band sequence. For encoding, the reference band is the set of data used to generate interband differences (see FIG. 6). For decoding, the reference band is the set of data to which the decoded differences are added (see FIG. 18).

In general, the present invention supports the encoding of each band sequence independent of all of the other band sequences of the video stream. As such, the reference bands used in decoding each band sequence are distinct from (i.e., not affected by) the decoding of all of the other band sequences. As a result, any one or more band sequences can be dropped without adversely affecting the decoding of the remaining band sequences. In this way, the present invention supports video playback scalability.

Under the present invention, video playback scalability can be exploited in, at least, two different ways: decode scalability and bitrate scalability. Decode scalability applies when a video decoding system, such as system 200 of FIG. 2, is unable to decode all of the encoded band sequences of the encoded bitstream while maintaining the frame rate at which the data was encoded. In such a case, the video decoding system only decodes a subset of the encoded band sequences (i.e., drops one or more of the encoded band sequences). Since not all of the encoded data is used to generate the decoded images for display, the image quality will be diminished, but the desired frame rate will be maintained.

Bitrate scalability applies when the transmission bandwidth of a video decoding system is sufficiently limited. For a system like decoding system 200 of FIG. 2, a transmission bottleneck could be related to the reading of encoded signals from mass storage device 212, the receipt of encoded signals by receiver 210 from remote transmitter, or transmission of the encoded signals over system bus 206. In any case, if there is insufficient bandwidth to transmit all of the encoded band sequences, one or more of them may be dropped (i.e., not transmitted). In this case, the decoder decodes only the transmitted portion of the bitstream. Here, too, the image quality of the video playback is diminished without affecting the displayed frame rate.

Those skilled in the art will understand that the selection of which encoded band sequences are dropped (for either transmission or decoding) can be fixed for a particular decoding environment or adaptively selected in real-time based on the transmission or processing bandwidth that is currently available.

Those skilled in the art will also understand that the present invention provides the playback scalability benefit of wavelet transforms without having to sacrifice the use of motion estimation and motion compensation, which typically reduces the size of the compressed bitstream.

Referring now to FIGS. 24–28, there are shown graphical representations of five different cases of playback supported by the present invention. Those skilled in the art will understand that the Band Y0 data corresponds to the lowest frequency Y-component data generated by the preferred wavelet transform, while the Band Y3 data corresponds to the highest frequency Y-component data, with Band Y1 lower than Band Y2. Since the human eye is most sensitive to low-frequency visual data, the Band Y0 data is the most important Y-component data to decode, followed in order by the Band Y1, the Band Y2, and lastly the Band Y3 data. The five different cases shown in FIGS. 24–28 were designed to exploit these relationships. It will be understood that other cases are also possible.

FIG. 24 shows Case 1 in which all four bands of Y-component data are decoded. In Case 1, the inverse wavelet transform of Equation (2) is applied.

FIG. 25 shows Case 2 in which Bands Y0, Y1, and Y2 are decoded (i.e., Band Y3 is dropped). In one possible implementation of Case 2, the decoded Y-component plane is constructed by applying the transform of Equation (2) in which each b3 value is set to zero. In another possible implementation, the Band Y2 data is interpolated vertically (i.e., an interpolated b2 value is generated below each b2 value in the vertical direction). The transform of Equation (2) is then applied with the interpolated b2 values used for the b3 values. In yet another possible implementation, the Band Y1 data is interpolated horizontally (i.e., an interpolated b1 value is generated to the right of each b1 value in the horizontal direction). The transform of Equation (2) is then applied with the interpolated b1 values used for the b3 values.

FIG. 26 shows Case 3 in which Bands Y0 and Y1 are decoded (i.e., Bands Y2 and Y3 are dropped). In Case 3, p0 and p2 are generated using the following Equation (3), derived from Equation (2) where b2 and b3 are both zero:

$$p0 = [(b0+b1)+2] >> 2$$
$$p2 = [(b0-b1)+2] >> 2 \qquad (3)$$

In one possible implementation of Case 3, p1 and p3 are generated by horizontally replicating p0 and p2, respectively. In another possible implementation, p1 and p3 are generated by horizontally interpolating p0 and p2, respectively.

FIG. 27 shows Case 4 in which Bands Y0 and Y2 are decoded (i.e., Bands Y1 and Y3 are dropped). In Case 4, p0 and p1 are generated using the following Equation (4), derived from Equation (2) where b1 and b3 are both zero:

$$p0 = [(b0+b2)+2] >> 2$$
$$p1 = [(b0-b2)+2] >> 2 \qquad (4)$$

In one possible implementation of Case 4, p2 and p3 are generated by vertically replicating p0 and p1, respectively. In another possible implementation, p2 and p3 are generated by vertically interpolating p0 and p1, respectively.

FIG. 28 shows Case 5 in which only Band Y0 is decoded (i.e., Bands Y1, Y2, and Y3 are dropped). In Case 5, two-dimensional interpolation or replication is performed. Alternatively, the Band Y0 data can be used with the subsampled U and V data to display decoded images at a quarter size (Case 6).

processing capability (high, medium, or low) and (2) scalability (on or off). The user's selection of these two parameters translates into one of six different encoding modes which are defined in the table below.

| Mode | Target Platform | Scalability | # of Y Bands | Y-Band Transforms | UV-Band Transforms | Motion Vector Resolution |
|---|---|---|---|---|---|---|
| 0 | High | On | 4 | Sl8×8, Sl1×8, Sl8×1, None | Sl4×4 | Half Pixel |
| 1 | Medium | On | 4 | Hr8×8, Hr1×8, Hr8×1, None | Hr4×4 | Half Pixel |
| 2 | Low | On | 4 | Hr8×8 None, None, None | Hr4×4 | Integer Pixel |
| 3 | High | Off | 1 | Sl8×8 | Sl4×4 | Half Pixel |
| 4 | Medium | Off | 1 | Hr8×8 | Hr4×4 | Half Pixel |
| 5 | Low | Off | 1 | Hr8×8 | Hr4×4 | Integer Pixel |

In general, Cases 1–6 are arranged in order of decreasing image quality and decreasing processing bandwidth requirement, with Case 1 having the highest image quality, while requiring the greatest processing bandwidth.

Decode Rate Control

Conventional video codecs are designed to generate encoded video either for playback on fixed-function hardware or for software-only playback. Such conventional video codecs are not tunable for a variety of video playback systems. If they are designed for high-end playback systems, then low-end systems do a poor job playing back the encoded video. If they are designed for low-end systems, then there is no significant improvement when playing back the encoded video on high-end systems.

Encoding system 100 of FIG. 1, on the other hand, is capable of generating encoded video for a variety of video playback systems, such as decoding system 200 of FIG. 2. The user of encoding system 100 can tune the video encoding processing to generate an encoded video bitstream for a desired playback environment. Tuning is accomplished by specifying values for parameters that control the flow of the video encoding processing. These parameters preferably control:

Whether scalability is enabled;

Whether the Y-component plane is globally decomposed into four bands;

Whether each of the U- and V-component planes is globally decomposed into four bands;

Which block transform is applied to the blocks of each of the different bands;

Whether the quantization delta is inherited from the first band of Y-component data;

Whether the motion vectors and frame type are inherited from the first band of Y-component data;

The size of the Y-component macroblocks;

The size of the Y-component blocks;

The size of the U- and V-component macroblocks;

The size of the U- and V-component blocks;

In a preferred embodiment, there are two user-selectable parameters that effect the encoding mode: (1) target platform Those skilled in the art will understand that the different encoding modes generate encoded video that requires different amounts of processing bandwidth to decode. For example, Mode 0 is identical to Mode 1, except that Slaar transforms are used in Mode 0 while Mode 1 uses computationally less demanding Haar transforms. As a result, video signals encoded using Mode 0 require a greater amount of decode processing bandwidth (i.e., more MIPS) than video signals encoded using Mode 1.

Of course, other modes can be designed with different combinations of parameter values to achieve encoded video tuned for a wide variety of playback platforms. This ability to select, during encode processing, the level of processing bandwidth required for playback is called "decode rate control." In general, an encoding mode corresponding to a higher decode bandwidth provides decoded video images of higher quality than those provided by an encoding mode corresponding to a lower decode bandwidth.

Decode rate control provides a user of encoding system 100 with the ability to design an encoded bitstream for a target playback system. Decode rate control also provides the user of encoding system 100 with the ability to trade off CPU usage for video quality for a given playback system.

Moreover, decode rate control may be used dynamically to change the decode bandwidth within an encoded video bitstream. This may be advantageous in a controlled environment such as a video game. The game designer may wish to vary the CPU usage allocated to video decode processing during the course of the video game. More CPU usage may be allocated to the video portion of the game when little else is happening. When the non-video portion of the game requires more CPU usage, decode rate control may be used to throttle back the video decode bandwidth.

As described above, one mechanism for achieving decode rate control is the selection of the types of block transforms applied to the different component bands. In general, a discrete cosine transform requires a greater decode bandwidth (and produces a decoded image of higher quality) than a discrete slant transform. Similarly, a discrete slant transform generally requires a greater decode bandwidth (and produces a decoded image of higher quality) than a Haar transform. Moreover, a two-dimensional transform of a given type generally requires a greater decode bandwidth (and produces a decoded image of higher quality) than a one-dimensional transform of the same type.

Another mechanism for achieving decode rate control is in the selection of the type of motion compensation to apply. The threshold question is whether motion compensation is to be applied at all (or with zero motion vectors only). Another issue is whether motion compensation is to be based on average prediction, wherein the motion compensated signals are derived from the average of applying a first motion vector to a first (e.g., previous) reference frame and applying a second motion vector to a second (subsequent) reference frame.

Structure of Encoded Bitstream

This section describes a preferred structure for the encoded bitstream generated by the encoding system of FIG. 1 and decoded by the decoding system of FIG. 2. The bitstream structure is hierarchial; that is, the bitstream consists of data at several layers, which are:

```
Picture
  Band
    Tile
      Macroblock
        Block
```

A typical bitstream would look like the following:
Picture Header, Band0, Band 1, Band2, Band3, . . . , BandN, Picture Header, Band0, . . .
where each Bandi looks like:
BandN Header, Tile0, Tile1, Tile2, . . . , TileM
where each Tilej looks like:
TileM Header, Macroblock Data (for all macroblocks), Block Data (for all blocks)

A picture is one image (i.e., frame) of the video stream. The bitstream supports pictures in different formats, for example, YVU9 or YVU12 format. A picture consists of three component planes (Y, U, and V). Each component plane may be subdivided into one or more bands using the global wavelet decomposition. Each picture contains a description of how the Y plane and U,V planes are subdivided. The subdivision for Y may be different from the subdivision for U,V. The planes are stored in the order: Y, V, U, followed optionally by a transparency plane. Within each plane, the bands are stored sequentially starting from band 0. There are no plane level structures in the bitstream, e.g., there is no plane header. All plane information is stored in the picture header.

Each band is subdivided into a regular grid of tiles, each of which is encoded in a self-contained section of the bitstream. Tiles permit local decoding of a video sequence (i.e., decoding of a sub-rectangle of the picture), and are also useful in minimizing latency in real-time encoding and decoding. Each tile is subdivided into a regular grid of macroblocks and blocks. Bits in the band header specify what the macroblock and block sizes are for all tiles in this band. Macroblocks can be either 16×16, 8×8, or 4×4. Blocks are either 8×8 or 4×4.

The value 128 is subtracted from each (8-bit) pixel before encoding begins, and added back at the end of decoding. This centers all of the band data around 0, including the Band Y0 data. The color conversion stage (i.e., the final stage in the decoding process) uses 7-bit pixels in order to perform four-way pseudo-SIMD processing. The precision loss sacrifice is not made when reading in pixels. Input pixels in all planes are restricted to the range (16,240). Decoded pixels in all planes are clamped to the range (0,255).

The transparency band (if present) is bit plane, where each bit corresponds to a different pixel of the image and indicates whether the pixel is transparent. The transparency band is encoded by run-length encoding the bit plane, where the runs alternate between runs of 1's and runs of 0's. The runs are then Huffman encoded using a specified transparency codebook.

Block Transform

This section describes the processing of forward block transform 606 and inverse block transform 616 of FIG. 6. In a preferred embodiment of the present invention, transforms 606 and 616 may be any of the following transforms:

DCT8×1: an (8×1) discrete cosine transform,
DCT1×8: a (1×8) discrete cosine transform,
DCT8×8: an (8×8) discrete cosine transform,
DCT4×4: a (4×4) discrete cosine transform,
Slant8×1: an (8×1) slant transform,
Slant1×8: a (1×8) slant transform,
Slant8×8: an (8×8) slant transform,
Slant4×1: a (4×1) slant transform,
Slant1×4: a (1×4) slant transform,
Slant4×4: a (4×4) slant transform,
Slaar8×1: an (8×1) hybrid slant-Haar transform,
Slaar1×8: a (1×8) hybrid slant-Haar transform,
Slaar8×8: an (8×8) hybrid slant-Haar transform,
Slaar4×1: a (4×1) hybrid slant-Haar transform,
Slaar1×4: a (1×4) hybrid slant-Haar transform,
Slaar4×4: a (4×4) hybrid slant-Haar transform,
Haar8×1: an (8×1) Haar transform,
Haar1×8: a (1×8) Haar transform,
Haar8×8: an (8×8) Haar transform,
Haar4×1: a (4×1) Haar transform,
Haar1×4: a (1×4) Haar transform, and
Haar4×4: a (4×4) Haar transform.

In general, a different transform may be applied each different band of component data. DCT transforms are well known in the art. Preferred embodiments of the other listed transforms are presented in the following sections.

Those skilled in the art will understand that, for a given size (e.g., 8×8), a DCT (discrete cosine transform) provides higher quality results than either a slant or a Haar transform, but that a DCT transform is also computationally more complex. A Haar transform is computationally less complex than a DCT or a slant transform, but also provides lower quality results.

A "Slaar" transform is a hybrid of a slant and a Haar transform. The Slaar transform has been developed to provide a high-speed block transform of intermediate complexity as an alternative to the slant and Haar transforms. The Slaar transform is computationally simpler than the slant transform, yet provides results better than the Haar transform and almost as good as the slant transform.

For example, where the forward Slant8 transform (described below) uses 32 additions and 12 integer multiplications, the forward Slaar8 transform uses only 28 additions and only 8 integer multiplications. The forward Haar8 transform uses 14 additions and no integer multiplications.

The Slaar transform is separable transform in that there is no cross-band interaction after the first stage of the transform. This makes the Slaar transform suitable for scalable applications where higher bands may be dropped for scalability. The associated drift due to the dropping of the higher bands for difference blocks is minimal for the Slaar transform since the drift occurs only during the last stage of the inversion as compared to the slant transform, where the drift occurs at all stages of the inversion.

In a Haar transform, butterfly operations are initially performed. After this first stage, the low-frequency results are collected and the high-frequency results are collected. All subsequent processing is separated between the high-frequency results and the low-frequency results. As such, the Haar exploits local redundancy in the first stage and continues to exploit local redundancy in the later stages.

Those skilled in the art will recognize that the Slaar transform exploits local redundancy in the first stage and then exploits more remote redundancies in the later stages. The first stage of the Slaar transform applies an invertible frequency decomposition on n input samples to generate $\eta/2$ high-frequency values and $\eta/2$ low-frequency values (e.g., same as the first stage of a Haar or Daubechies transform). The second stage of the Slaar transform is an $(\eta/2 \times 1)$ transform that is either a generalized slant or a DCT transform (i.e., not a Haar or Hademard transform).

Slant8×1, Slant1×8

The Slant8×1 transform is the Slant8 transform applied to each of the eight rows in an 8×8 block and the Slant1×8 transform is the Slant8 transform applied to each of the eight columns in an 8×8 block. The forward Slant8 transform is defined by the following C code:

```
{
#define bfly(x,y) t1 = x-y; x += y; y = t1;
#define NUM1   40
#define NUM2   16
#define DEN    29
/* The following is a reflection using a,b = 16/29, 40/29 without
prescale and with rounding. */
#define freflect(s1,s2)\
    t = ((NUM1*s1) + (NUM2*s2) + DEN/2)/DEN;\
    s2 = ((NUM2*s1) - (NUM1*s2) + DEN/2)/DEN;\
    s1 = t;
    r1 = *src++;
    r2 = *src++;
    r3 = *src++;
    r4 = *src++;
    r5 = *Src++;
    r6 = *src++;
    r7 = *src++;
    r8 = *Src++;
    bfly(r1,r4); bfly(r2,r3); bfly(r5,r8);           //FSlantPart1
    bfly(r6,r7);
    bfly(r1,r2); freflect(r4,r3); bfly(r5,r6);       //FSlantPart2
    freflect(r8,r7);
    bfly(r1,r5); bfly(r2,r6); bfly(r7,r3);           //FSlantPart3
    bfly(r4,r8);
    t = r5 - (r5>>3) + (r4>>1);                      //FSlantPart4
    r5 = r4 - (r4>>3) - (r5>>1); r4 = t;
    *dst++ = r1;
    *dst++ = r4;
    *dst++ = r8;
    *dst++ = r5;
    *dst++ = r2;
    *dst++ = r6;
    *dst++ = r3;
    *dst++ = r7;
}
``` where:

Src is a pointer to the input linear (e.g., 8×1) array to be forward transformed, and Dst is a pointer to the output linear (e.g., 8×1) forward transformed array.

The inverse Slant8 transform is defined by the following C code:

```
{
#define bfly(x,y) t1 = x-y; x += y; y = t1;
/* The following is a reflection with rounding using a,b =
1/2, 5/4. */
#define reflect(s1,s2)\
    t = (s1*5 + s2*2 + 2) >> 2;\
    s2 = (s1*2 - s2*5 + 2) >> 2;\
    s1 = t;
    r1 = *Src++;
    r4 = *Src++;
    r8 = *Src++;
    r5 = *Src++;
    r2 = *Src++;
    r6 = *Src++;
    r3 = *Src++;
    r7 = *Src++;
    t = (r4*4 + r5*7 + 4) >> 3;                      //ISlantPart1
    r5 = (r4*7 - r5*4 + 4) >> 3;
    r4 = t;
    bfly(r1,r5); bfly(r2,r6); bfly(r7,r3); bfly(r4,r8);   //ISlantPart2
    bfly(r1,r2); reflect(r4,r3); bfly(r5,r6);        //ISlantPart3
    reflect(r8,r7);
    bfly(r1,r4); bfly(r2,r3); bfly(r5,r8); bfly(r6,r7);   //ISlantPart4
    *Dst++ = r1;
    *Dst++ = r2;
    *Dst++ = r3;
    *Dst++ = r4;
    *Dst++ = r5;
    *Dst++ = r6;
    *Dst++ = r7;
    *Dst++ = r8;
}
``` where:

Src is a pointer to the input linear (e.g., 8×1) array to be inverse transformed, and Dst is a pointer to the output linear (e.g., 8×1) inverse transformed array.

Slant8×8

The forward Slant8×8 transform has three parts:

(1) Slant8×1 forward, (2) Slant1×8 forward, and (3) For each coefficient c(i,j)

$$c(i,j)=(c(i,j)+16)>>5$$

This last step normalizes the output of the transform to 12 bits of precision in order to support pseudo-SIMD implementation.

The inverse Slant8×8 transform also has three parts:

(1) Slant1×8 inverse, (2) Slant8×1 inverse, and (3) For each coefficient c(i,j)

$$c(i,j)=(c(i,j)+1)>>1$$

This last step compensates for the normalization performed during the forward transform. Those skilled in the art will understand that, in a symmetric slant transform, the forward and inverse transforms each contain a shift down of 3 bits.

Slant4×1, Slant1×4

The Slant4×1 transform is the Slant4 transform applied to each of the four rows in a 4×4 block and the Slant1×4 transform is the Slant4 transform applied to each of the four columns in a 4×4 block. The forward Slant4 transform is defined by the following C code:

```
{
#define bfly(x,y) t1 = x-y; x += y; y = t1;
#define NUM1 40
#define NUM2 16
#define DEN 29
/* The following is a reflection using a,b = 16/29, 40/29 without
prescale and with rounding. */
#define freflect(s1,s2)\
    t = ((NUM1*s1) + (NUM2*s2) +DEN/2)/DEN;\
    s2 = ((NUM2*s1) - (NUM1*s2) + DEN/2)/DEN;\
    s1 = t;
    r1 = *Src++;
    r2 = *Src++;
    r3 = *Src++;
    r4 = *Src++;
    bfly(r1,r4); bfly(r2,r3);       //FSlantPart1
    freflect(r4,r3); bfly(r1,r2);   //FSlantPart2
    *Dst++ = r1;
    *Dst++ = r4;
    *Dst++ = r2;
    *Dst++ = r3;
}
``` where:

Src is a pointer to the input linear (e.g., 4×1) array to be forward transformed, and Dst is a pointer to the output linear (e.g., 4×1) forward transformed array.

The inverse Slant4 transform is defined by the following C code:

```
{
#define bfly(x,y) t1 = x-y; x += y; y = t1;
/* The following is a reflection with rounding using a,b
= 1/2, 5/4. */
#define reflect(s1,s2)\
    t = (s1*5 + s2*2 + 2) >> 2;\
    s2 = (s1*2 - s2*5 + 2) >> 2;\
    s1 = t;
        r1 = *p++;
        r4 = *p++;
        r2 = *p++;
        r3 = *p++;
        bfly(r1,r2); reflect(r4,r3);    //SlantPart1
        bfly(r1,r4); bfly(r2,r3);       //SlantPart2
        *p++ = r1;
        *p++ = r2;
        *p++ = r3;
        *p++ = r4;
}
``` where:

Src is a pointer to the input linear (e.g., 4×1) array to be inverse transformed, and Dst is a pointer to the output linear (e.g., 4×1) inverse transformed array.

Slant4×4

The forward Slant4×4 transform has three parts:

(1) Slant4×1 forward, (2) Slant1×4 forward, and (3) For each coefficient c(i,j)

$$c(i,j)=(c(i,j)+2)>>2$$

The inverse Slant4×4 transform also has three parts:

(1) Slant1×4 inverse, (2) Slant4×1 inverse, and (3) For each coefficient c(i,j)

$$c(i,j)=(c(i,j)+2)>>2$$

Slaar8×1, Slaar1×8

The Slaar8×1 transform is the Slaar8 transform applied to each of the eight rows in an 8×8 block and the Slaar1×8 transform is the Slaar8 transform applied to each of the eight columns in an 8×8 block. The forward Slaar8 transform is defined by the following C code:

```
{
#define bfly(x,v) t1 = x-y; x +=y; y = t1;
#defineNUM1 40
#define NUM2 16
#define DEN 29
/* The following is a reflection using a,b = 16/29, 40/29. */
#define freflect(s1,s2)\
    t = ((NUM1*s1) + (NUM2*s2) + DEN/2 )/DEN;\
    s2 = ((NUM2*s1) - (NUM1*s2) + DEN/2 )/DEN;\
    s1 = t;
/* The following is a reflection using a,b = 1/2, 5/4. */
#define freflect(s1,s2)\
    t = s1 + (s1>>2) + (s2>>1);\
    s2 = -s2 - (s2>>2) + (s1>>1);\
    s1 = t;
    r1 = *Src++;
    r2 = *Src++;
    r3 = *Src++;
    r4 = *Src++;
    r5 = *Src++;
    r6 = *Src++;
    r7 = *Src++;
    r8 = *Src++;
    bfly(r1,r2); bfly(r3,r4); bfly(r5,r6); bfly(r7,r8);
    bfly(r1,r7); bfly(r3,r5); bfly(r2,r8); bfly(r4,r6);
    freflect(r7,r5); bfly(r1,r3); freflect(r8,r6); bfly(r2,r4);
    *Dst++ = r1;
    *Dst++ = r7;
    *Dst++ = r3;
    *Dst++ = r5;
    *Dst++ = r2;
    *Dst++ = r8;
    *Dst++ = r4;
    *Dst++ = r6;
}
```

The inverse Slaar8 transform is defined by the following C code:

```
{
#define bfly(x,y) t1 = x-y; x += y; y = t1;
#define bfly2(x,y) t1 = x-y; x += y; y = DIV2(t1);
    x = DIV2(x);
#define reflect(s1,s2) t = s1 + (s1>>2) + (s2>>1);
    s2 = -s2 - (s2>>2) + (s1>>1); s1 = t;
    r1 = *Src++;
    r7 = *Src++;
    r3 = *Src++;
    r5 = *Src++;
    r2 = *Src++;
    r8 = *Src++;
    r4 = *Src++;
    r6 = *Src++;
    reflect(r7,r5); bfly(r1,r3); reflect(r8,r6); bfly(r2,r4);
    bfly(r1,r7); bfly(r3,r5); bfly(r2,r8); bfly(r4,r6);
    bfly2(r1,r2); bfly2(r3,r4); bfly2(r5,r6); bfly2(r7,r8);
    *Dst++ = r1;
    *Dst++ = r2;
    *Dst++ = r3;
    *Dst++ = r4;
    *Dst++ = r5;
    *Dst++ = r6;
    *Dst++ = r7;
    *Dst++ = r8;
}
```

The inverse Slaar8 transform is preferably implemented with fixed reflection coefficients a,b=1/2, 5/4. This provides a fast implementation that is useful for real-time decoding. The forward Slaar8 transform may be implemented with either of two sets of fixed reflection coefficients. The set a,b=½, ⅝ is preferably used for real-time encoding, while the set a,b=16/29, 40/29 is preferably used for off-line, non-real-time encoding.

These values for a,b are derived as follows. Let a and b be the reflection coefficients of the forward transform, and c and d be the reflection coefficients of the inverse transform. Then the condition for perfect inversion is:

$$\begin{bmatrix} a & b \\ b & -a \end{bmatrix} \begin{bmatrix} c & d \\ d & -c \end{bmatrix} = \begin{bmatrix} 2 & 0 \\ 0 & 2 \end{bmatrix} \quad (5)$$

Equation (5) implies that:

$$ac+bd=2 \quad (6)$$

and $$ad=bc. \quad (7)$$

For a symmetric transform, a=c and b=d. Thus, from Equation (6):

$$a*a+b*b=2. \quad (8)$$

In an exact floating point slant transform, to have exactly linear basis vectors, b=3a. Thus, from Equation (8):

$$3a,3a+a*a=2 \quad (9)$$

which implies that $$a = \frac{1}{\sqrt{5}} \quad (10)$$

and $$b = \frac{3}{\sqrt{5}} \quad (11)$$

For a fixed-point symmetric implementation, any convenient (i.e., easy to compute) values for a,b may be chosen that approximately satisfies Equation (8). In addition, to maintain a linear basis, the values for a,b should stay relatively close to the b=3a condition. The values a,b=½, ⅝ satisfy these two criteria. As such, a symmetric transform may be implemented using a,b=½, ⅝ and a scale factor of 2.

To find values for c,d that give perfect reconstruction in an asymmetric implementation, the values a,b=½, ⅝ are used in Equations (6) and (7). Solving Equation (7) for d and using a,b=½, ⅝ yields:

$$d = \frac{bc}{a} = \frac{5c}{2} \quad (12)$$

Using Equation (12) and a,b=½, ⅝ in Equation (6) yields:

$$c/2+5*(5c/2)/4=2 \quad (13)$$

Solving Equation (13) for c yields c=16/29. Using that result in Equation (12) yields d=40/29.

Slaar8×8

The forward Slaar8×8 transform has three parts:

(1) Slaar8×1 forward, (2) Slaar1×8 forward, and (3) For each coefficient c(i,j)

$$c(i,j)=(c(i,j)+16)>>5$$

The inverse Slaar8×8 transform also has three parts:

(1) Slaar1×8 inverse, (2) Slaar8×1 inverse, and (3) For each coefficient c(i,j)

$$c(i,j)=(c(i,j)+1)>>1$$

Slaar4×1, Slaar1×4

The Slaar4×1 transform is the Slaar4 transform applied to each of the four rows in a 4×4 block and the Slaar1×4 transform is the Slaar4 transform applied to each of the four columns in a 4×4 block. The forward Slaar4 transform is defined by the following C code:

```
{
#define bfly(x,y) t1 = x-y; x += y; y = t1;
#define NUM1 40
#define NUM2 16
#define DEN 29
/* The following is a reflection using a,b = 16/29, 40/29 without
   prescale and with rounding. */
#define freflect(s1,s2)\
    t = ((NUM1*s1) + (NUM2*s2) + DEN/2 )/DEN;\
    s2 = ((NUM2*s1) - (NUM1*s2) + DEN/2 )/DEN;\
    s1 = t;
    r1 = *Src++;
    r2 = *Src++;
    r3 = *Src++;
    r4 = *Src++;
    bfly(r1,r2); bfly(r3,r4);    // FSlaarPart1
    bfly(r1,r3); bfly(r2,r4);    // FSlaarPart2
    *Dst++ = r1;
    *Dst++ = r3;
    *Dst++ = r2;
    *Dst++ = r4;
}
```

The inverse Slaar4 transform is defined by the following C code:

```
{
#define bfly(x,y) t1 = x-y; x += y; y = t1;
/* The following is a reflection using a,b = ½, ⅝. */
#define reflect(s1,s2)\
    t = s1 + (s1>>2) + (s2>>1);\
    s2 = -s2 - (s2>>2) + (s1>>1);\
    s1 = t;
    r1 = *p++;
    r3 = *p++;
    r2 = *p++;
    r4 = *p++;
    bfly(r1,r3); bfly(r2,r4);  // ISlaarPart 1
    bfly(r1,r2); bfly(r3,r4);  // ISlaarPart 2
    *p++ = r1;
    *p++ = r2;
    *p++ = r3;
    *p++ = r4;
}
``` where:

Src is a pointer to the input linear (e.g., 4×1) array to be inverse transformed, and Dst is a pointer to the output linear (e.g., 4×1) inverse transformed array.

Slaar4×4

The forward Slaar4×4 transform has three parts:

(1) Slaar4×1 forward, (2) Slaar1×4 forward, and (3) For each coefficient c(i,j)

$$c(i,j)=(c(i,j)+2)>>2$$

The inverse Slaar4×4 transform also has three parts:
(1) Slaar1×4 inverse,
(2) Slaar4×1 inverse, and
(3) For each coefficient c(i,j)

$$c(i,j)=(c(i,j)+2)>>2$$

Haar8×1, Haar1×8

The Haar8×1 transform is the Haar8 transform applied to each of the eight rows in an 8×8 block and the Haar1×8 transform is the Haar8 transform applied to each of the eight columns in an 8×8 block. The forward Haar8 transform is defined by the following C code:

```
{
#define DIV2(x)     ((x)>0?(x)>>1:-(-(x))>>1)
#define bfly(x,y) t1 = x-y; x += y; y = t1;
#define bfly2(x,y) t1 = x-y; x += y; y = DIV2(t1);
    x = DIV2(x);
    r1 = *Src++;
    r2 = *Src++;
    r3 = *Src++;
    r4 = *Src++;
    r5 = *Src++;
    r6 = *Src++;
    r7 = *Src++;
    r8 = *Src++;
    bfly(r1,r2); bfly(r3,r4); bfly(r5,r6); bfly(r7,r8);    //HaarFwd1
    bfly(r1,r3); bfly(r5,r7);                              //HaarFwd2;
    bfly(r1,r5);                                           //HaarFwd3;
    r1 = DIV2(r1);
    r5 = DIV2(r5);
    *Dst++ = r1;
    *Dst++ = r5;
    *Dst++ = r3;
    *Dst++ = r7;
    *Dst++ = r2;
    *Dst++ = r4;
    *Dst++ = r6;
    *Dst++ = r8;
}
```

The inverse Haar8 transform is defined by the following C code:

```
{
#define DIV2(x)     ((x)>0?(x)>>1:-(-(x))>>1)
#define bfly2(x,y) t1 = x-y; x += y; y = DIV2(t1); x = DIV2(x);
    r1 = *Src++;
    r1 = r1<<1;
    r5 = *Src++;
    r5 = r5<<1;
    r3 = *Src++;
    r7 = *Src++;
    r2 = *Src++;
    r4 = *Src++;
    r6 = *Src++;
    r8 = *Src++;
    bfly2(r1,r5);                                       //HaarInv1;
    bfly2(r1,r3); bfly2(r5,r7);                         //HaarInv2;
    bfly2(r1,r2); bfly2(r3,r4); bfly2(r5,r6);           //HaarInv3;
    bfly2(r7,r8);
    *Dst++ = r1;
    *Dst++ = r2;
    *Dst++ = r3;
    *Dst++ = r4;
    *Dst++ = r5;
    *Dst++ = r6;
```

```
    *Dst++ = r7;
    *Dst++ = r8;
}
```

Haar8×8

The forward Haar8×8 transform has three parts:

```
(1) Haar8×1 forward,
(2) Haar1×8 forward, and
(3) Scaling:
    for(i=0; i<8; i++)
    {
        for(j=0; j<8; j++)
        {
            c(i,j) = ( c(i,j))>> Scaling Matrix[i][j]
        }
    }
``` where the ScalingMatrix is defined as follows:

```
{   1, 1, 1, 1, 0, 0, 0, 0,
    1, 1, 1, 1, 0, 0, 0, 0,
    1, 1, 1, 1, 0, 0, 0, 0,
    1, 1, 1, 1, 0, 0, 0, 0,
    0, 0, 0, 0, 0, 0, 0, 0,
    0, 0, 0, 0, 0, 0, 0, 0,
    0, 0, 0, 0, 0, 0. 0. 0,
    0, 0, 0, 0, 0, 0, 0, 0   }
```

The inverse Haar8×8 transform also has three parts:

```
(1) Scaling:
    for(i=0; i<8; i++)
    {
        for(j=0; j<8; j++)
        {
            c(i,j) = (c(i,j)) >> ScalingMatrix[i][j]
        }
    }
``` where the ScalingMatrix is defined as follows:

```
{   1, 1, 1, 1, 0, 0, 0, 0,
    1, 1, 1, 1, 0, 0, 0, 0,
    1, 1, 1, 1, 0. 0, 0, 0,
    1, 1, 1, 1, 0. 0. 0, 0,
    0, 0, 0, 0, 0, 0, 0, 0,
    0, 0, 0, 0, 0, 0, 0, 0,
    0, 0, 0, 0, 0, 0, 0, 0,
    0, 0, 0, 0, 0, 0, 0, 0,   }
(2) Haar1×8 inverse, and
(3) Haar8×1 inverse.
```

Haar4×1, Haar1×4

The Haar4×1 transform is the Haar4 transform applied to each of the four rows in a 4×4 block and the Haar1×4 transform is the Haar4 transform applied to each of the four columns in a 4×4 block. The forward Haar4 transform is defined by the following C code:

```
{
#define DIV2(x)     ((x)>0?(x)>>1:-(-(x))>>1)
#define bfly(x,y) t1 = x-y; x += y; y = t1;
#define bfly2(x,y) t1 = x-y; x += y; y = DIV2(t1); x = DIV2(x);
    r1 = *Src++;
    r3 = *Src++;
    r5 = *Src++;
```

```
r7 = *Src++;
bfly(r1,r3); bfly(r5,r7);    //HaarFwd1;
bfly(r1,r5);                 //HaarFwd2;
*Dst++ = r1;
*Dst++ = r5;
*Dst++ = r3;
*Dst++ = r7;
}
```

The inverse Haar8 transform is defined by the following C code:

```
{
#define DIV2(x)    ((x)>0?(x)>>1:-(-(x))>>1)
#define bfly2(x,y) t1 = x-y; x += y; y = DIV2(t1); x = DIV2(x);
    r1 = *Src++;
    r5 = *Src++;
    r3 = *Src++;
    r7 = *Src++;
    bfly2(r1,r5);                //HaarInv1;
    bfly2(r1,r3); bfly2(r5,r7);  //HaarInv2;
    *Dst++ = r1;
    *Dst++ = r3;
    *Dst++ = r5;
    *Dst++ = r7;
}
```

Haar4×4

The forward Haar4×4 transform has three parts:

```
(1) Haar4×1 forward,
(2) Haar1×4 forward, and
(3) Scaling:
    for(i=0; i<4; i++)
    {
        for(j=0; j<4; j++)
        {
            c(i,j) = c(i,j)) >> ScalingMatrix[i][j]
        }
    }
``` where the ScalingMatrix is defined as follows:

```
{   1, 1, 0, 0,
    1, 1, 0, 0,
    0, 0, 0, 0.
    0, 0, 0, 0    }
```

The inverse Haar4×4 transform also has three parts:

```
(1) Scaling:
    for(i=0; i<4; i++)
    {
        for(j=0; j<4; j++)
        {
            c(i,j) = ( c(i,j)) >> ScalingMatrix[i][j]
        }
    }
``` where the ScalingMatrix is defined as follows:

```
{   1, 1, 0, 0,
    1, 1, 0, 0,
    0, 0, 0, 0,
    0, 0, 0, 0   }
(2) Haar1×4 inverse, and
(3) Haar4×1 inverse.
```

Alternative Embodiments

In one embodiment of the present invention, the encode processing of FIG. 6 (including motion estimation) is applied to each of the six bands of each inter-encoded video frame. In another embodiment, the motion estimation of motion estimator 602 is applied only to the Band Y0 data. In this latter embodiment, the motion vectors generated for the Band Y0 data of a frame are used for all six bands of that frame. For example, when encoding Band Y1 data, motion-compensated differencer 604 applies motion compensation on the Band Y1 reference data using the Band Y0 motion vectors to generate the Band Y1 interband differences. In this embodiment, the Band Y0 motion vectors are encoded as part of encoded Band Y0. The decoded Band Y0 motion vectors are then inherited when decoding the other bands.

Those skilled in the art will understand that, compared with the embodiment in which motion estimation is applied to all six bands for each frame, using the Band Y0 motion vectors for all six bands (1) reduces the average encode processing time per frame, (2) reduces the average size of the encoded bitstream per frame, and (3) reduces the average decode processing time per frame. The encode processing time is reduced by removing the need to perform motion estimation on five of the six bands and removing the need to encode five of the six sets of motion vectors. The size of the encoded bitstream is reduced by removing the need to embed five of the six sets of encoded motion vectors into the bitstream. The decode processing time is reduced by removing the need to decode five of the six sets of encoded motion vectors.

Since, under the present invention, each band sequence can be encoded (and decoded) independent of the other band sequences, one or more of the band sequences can be encoded using a different encoding procedure. In general, under the present invention, each band sequence can theoretically be encoded using a different encoding procedure. Using different encoding schemes for different band sequences allows a codec designer to allocate different percentages of the available processing bandwidth to different levels.

For example, a more sophisticated encoding scheme (which requires greater decode bandwidth) can be used for the most important data (i.e., the Band Y0 data) than that used for some of the less important data (e.g., the Band Y3 data). For example, for high resolution video images, Band Y0 can be encoded using a fairly complex scheme (e.g., motion compensation followed by DCT block transformation followed by run-length and Huffman encoding). At the same time, the Band Y1 and Y2 data can be encoded using a scheme of intermediate complexity (e.g., similar to the complex scheme but with a one-dimensional Haar transform instead of a DCT transform), while the Band Y3 data is encoded using a low-complexity scheme such as vector quantization with no block transformation.

In the embodiment described earlier in this specification in conjunction with FIG. 4, a wavelet transform is applied to the Y-component plane of a YVU9-format video stream and the resulting six bands (Y0, Y1, Y2, Y3, U, and V) are encoded. Those skilled in the art will understand that alternative embodiments fall within the scope of the present invention. For example, the video stream may comprise video signals in data formats other than YVU9, such as, but not limited to, YVU12, YVU16, YVU24, and RGB24.

The preferred transform defined by Equations (1) and (2) is a modified Haar transform. It will be understood that wavelet transforms other than this preferred transform may be used with the present invention, such as a four-coefficient Daubechies transform. In addition, transforms other than wavelet transforms can be used to transform the component planes into multiple bands of data, such as pyramid representations or multiresolution decompositions. Transforms can also be applied to the U- and/or V-component planes to transform each of those planes into two or more bands. Moreover, additional transforms can be applied to one or more of the bands to generate still more bands. For example, a wavelet transform can be applied to Band Y0 to further transform Band Y0 into four bands. Each of these further bands is then encoded as a band sequence independent of all of the other bands. In general, the transforms can differ from component plane to component plane and from band to band.

The present invention can be embodied in the form of computer-implemented processes and apparatuses for practicing those processes. The present invention can also be embodied in the form of computer program code embodied in tangible media, such as floppy diskettes, CD-ROMs, hard drives, or any other computer-readable storage medium, wherein, when the computer program code is loaded into and executed by a computer, the computer becomes an apparatus for practicing the invention. The present invention can also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. A computer-implemented process for decoding variable-length encoded (VLE) signals of an encoded bitstream, comprising the steps of:
    (a) selecting a k-bit signal from the encoded bitstream;
    (b) retrieving a table entry from a lookup table using the k-bit signal as an index into the lookup table;
    (c) interpreting the table entry to determine how many complete VLE signals are to be decoded from the k-bit signal; and
    (d) retrieving from the table entry at least two decoded signals, if the k-bit signal comprises at least two complete VLE signals to be decoded.

2. The process of claim 1, further comprising the steps of:
    (e) retrieving from the table entry one decoded signal, if the k-bit signal comprises one complete VLE signal to be decoded; and
    (f) performing special processing to decode the k-bit signal, if the k-bit signal comprises no complete VLE signals to be decoded, wherein steps (a)–(f) are repeated for additional k-bit signals in the encoded bitstream and further comprising the step of updating, prior to repeating steps (a)–(f) for a next k-bit signal, a bitstream pointer for use in step (a) based on how many bits were decoded by performing steps (a)–(f) for a previous k-bit signal.

3. The process of claim 1, wherein the table entry comprises:
    a first value corresponding to how many bits in the k-bit signal correspond to the complete VLE signals;
    a second value corresponding to how many complete VLE signals are in the k-bit signal;
    a first decoded signal, if the second value indicates that the k-bit signal comprises at least one complete VLE signal; and
    a second decoded signal, if the second value indicates that the k-bit signal comprises at least two complete VLE signals.

4. The process of claim 3, wherein the table entry further comprises:
    a third value corresponding to a position of a special VLE signal in the k-bit signal; and
    a third decoded signal, if the second value indicates that the k-bit signal comprises at least three complete VLE signals.

5. The process of claim 4, wherein:
    the table entry comprises a 32-bit value;
    the first value comprises bits 0–3 of the table entry;
    the second value comprises bits 4–5 of the table entry;
    the third value comprises bits 6–7 of the table entry;
    the first decoded signal comprises bits 8–15 of the table entry;
    the second decoded signal comprises bits 16–23 of the table entry; and
    the third decoded signal comprises bits 24–31 of the table entry.

6. The process of claim 4, wherein the special VLE signal comprises an end-of-block signal.

7. The process of claim 1, wherein step (c) further comprises the steps of:
    (1) interpreting the table entry to determine whether the k-bit signal comprises a special VLE signal; and
    (2) decoding the special VLE signal, if the k-bit signal comprises the special VLE signal.

8. The process of claim 7, wherein step (c)(2) comprises the steps of:
    (a) interpreting the table entry to determine a position of the special VLE signal, if the k-bit signal comprises the special VLE signal; and
    (b) decoding the k-bit signal based on the position of the special VLE signal, if the k-bit signal comprises the special VLE signal.

9. The process of claim 1, further comprising the step of generating the lookup table at run time.

10. The process of claim 9, wherein the lookup table is generated at run time based on a specified VLE codebook and specified parameters, including a first parameter corresponding to a value for k and a second parameter corresponding to a maximum number of VLE signals that can be decoded per table lookup.

11. The process of claim 10, wherein parameters used to generate the VLE codebook are explicitly encoded into the bitstream.

12. The process of claim 1, wherein the encoded bitstream comprises encoded video signals.

13. The process of claim 1, wherein:
    the encoded bitstream comprises encoded video signals;
    the table entry comprises a 32-bit value; the table entry comprises:
        a first value corresponding to how many bits in the k-bit signal correspond to the complete VLE signals, the first value comprising bits 0–3 of the table entry;
        a second value corresponding to how many complete VLE signals are in the k-bit signal, the second value comprising bits 4–5 of the table entry;

a third value corresponding to a position of a special VLE signal in the k-bit signal, the third value comprising bits 6–7 of the table entry and the special VLE signal comprising an end-of-block signal;

a first decoded signal, if the second value indicates that the k-bit signal comprises at least one complete VLE signal, the first decoded signal comprising bits 8–15 of the table entry;

a second decoded signal, if the second value indicates that the k-bit signal comprises at least two complete VLE signals, the second decoded signal comprising bits 16–23 of the table entry; and a third decoded signal, if the second value indicates that the k-bit signal comprises at least three complete VLE signals, the third decoded signal comprising bits 24–31 of the table entry;

step (c) further comprises the steps of:
 (1) interpreting the table entry to determine whether the k-bit signal comprises the special VLE signal;
 (2) interpreting the table entry to determine the position of the special VLE signal, if the k-bit signal comprises the special VLE signal; and
 (3) decoding the k-bit signal based on the position of the special VLE signal, if the k-bit signal comprises the special VLE signal;

further comprising the steps of:
 (e) retrieving from the table entry one decoded signal, if the k-bit signal comprises one complete VLE signal to be decoded; and
 (f) performing special processing to decode the k-bit signal, if the k-bit signal comprises no complete VLE signals to be decoded;

steps (a)–(f) are repeated for additional k-bit signals in the encoded bitstream;

further comprising the step of updating, prior to repeating steps (a)–(f) for a next k-bit signal, a bitstream pointer for use in step (a) based on how many bits were decoded by performing steps (a)–(f) for a previous k-bit signal; and further comprising the step of generating the lookup table at run time based on a specified VLE codebook and specified parameters, including a first parameter corresponding to a value for k and a second parameter corresponding to a maximum number of VLE signals that can be decoded per table lookup.

14. An apparatus for decoding variable-length encoded (VLE) signals of an encoded bitstream, comprising:
 (a) means for selecting a k-bit signal from the encoded bitstream;
 (b) means for retrieving a table entry from a lookup table using the k-bit signal as an index into the lookup table;
 (c) means for interpreting the table entry to determine how many complete VLE signals are to be decoded from the k-bit signal; and
 (d) means for retrieving from tile table entry at least two decoded signals, if the k-bit signal comprises at least two complete VLE signals to be decoded.

15. The apparatus of claim 14, further comprising:
 (e) means for retrieving from the table entry one decoded signal, if tile k-bit signal comprises one complete VLE signal to be decoded; and
 (f) means for performing special processing to decode the k-bit signal, if the k-bit signal comprises no complete VLE signals to be decoded, wherein the processing of means (a)–(f) is repeated for additional k-bit signals in the encoded bitstream and further comprising means for updating, prior to repeating the processing of means (a)–(f) for a next k-bit signal, a bitstream pointer for use in means (a) based on how many bits were decoded by performing the processing of means (a)–(f) for a previous k-bit signal.

16. The apparatus of claim 14, wherein the table entry comprises:
 a first value corresponding to how many bits in the k-bit signal correspond to the complete VLE signals;
 a second value corresponding to how many complete VLE signals are in the k-bit signal;
 a first decoded signal, if the second value indicates that the k-bit signal comprises at least one complete VLE signal; and
 a second decoded signal, if the second value indicates that the k-bit signal comprises at least two complete VLE signals.

17. The apparatus of claim 16, wherein the table entry further comprises:
 a third value corresponding to a position of a special VLE signal in the k-bit signal; and
 a third decoded signal, if the second value indicates that the k-bit signal comprises at least three complete VLE signals.

18. The apparatus of claim 17, wherein:
 the table entry comprises a 32-bit value;
 the first value comprises bits 0–3 of the table entry;
 the second value comprises bits 4–5 of the table entry;
 the third value comprises bits 6–7 of the table entry;
 the first decoded signal comprises bits 8–15 of the table entry;
 the second decoded signal comprises bits 16–23 of the table entry; and
 the third decoded signal comprises bits 24–31 of the table entry.

19. The apparatus of claim 17, wherein the special VLE signal comprises an end-of-block signal.

20. The apparatus of claim 14, wherein means (c):
 interprets the table entry to determine whether the k-bit signal comprises a special VLE signal; and
 decodes the special VLE signal, if the k-bit signal comprises the special VLE signal.

21. The apparatus of claim 20, wherein means (c):
 interprets the table entry to determine a position of the special VLE signal, if the k-bit signal comprises the special VLE signal; and
 decodes the k-bit signal based on the position of the special VLE signal, if the k-bit signal comprises the special VLE signal.

22. The apparatus of claim 14, further comprising means for generating the lookup table at run time.

23. The apparatus of claim 22, wherein the lookup table is generated at run time based on a specified VLE codebook and specified parameters, including a first parameter corresponding to a value for k and a second parameter corresponding to a maximum number of VLE signals that can be decoded per table lookup.

24. The apparatus of claim 23, wherein parameters used to generate the VLE codebook are explicitly encoded into the bitstream.

25. The apparatus of claim 14, wherein the encoded bitstream comprises encoded video signals.

26. The apparatus of claim 14, wherein:

the encoded bitstream comprises encoded video signals;

the table entry comprises a 32-bit value;

the table entry comprises:

a first value corresponding to how many bits in the k-bit signal correspond to the complete VLE signals, the first value comprising bits 0–3 of the table entry;

a second value corresponding to how many complete VLE signals are in the k-bit signal, the second value comprising bits 4–5 of the table entry;

a third value corresponding to a position of a special VLE signal in the k-bit signal, the third value comprising bits 6–7 of the table entry and the special VLE signal comprising an end-of-block signal;

a first decoded signal, if the second value indicates that the k-bit signal comprises at least one complete VLE signal, the first decoded signal comprising bits 8–15 of the table entry;

a second decoded signal, if the second value indicates that the k-bit signal comprises at least two complete VLE signals, the second decoded signal comprising bits 16–23 of the table entry; and a third decoded signal, if the second value indicates that the k-bit signal comprises at least three complete VLE signals, the third decoded signal comprising bits 24–31 of the table entry;

means (c):

(1) interprets the table entry to determine whether the k-bit signal comprises the special VLE signal;

(2) interprets the table entry to determine the position of the special VLE signal, if the k-bit signal comprises the special VLE signal; and (3) decodes the k-bit signal based on the position of the special VLE signal, if the k-bit signal comprises the special VLE signal;

further comprising:

(e) means for retrieving from the table entry one decoded signal, if the k-bit signal comprises one complete VLE signal to be decoded; and (f) means for performing special processing to decode the k-bit signal, if the k-bit signal comprises no complete VLE signals to be decoded;

the processing of means (a)–(f) is repeated for additional k-bit signals in the encoded bitstream;

further comprising means for updating, prior to repeating the processing of means (a)–(f) for a next k-bit signal, a bitstream pointer for use in means (a) based on how many bits were decoded by performing the processing of means (a)–(f) for a previous k-bit signal; and further comprising means for generating the lookup table at run time based on a specified VLE codebook and specified parameters, including a first parameter corresponding to a value for k and a second parameter corresponding to a maximum number of VLE signals that can be decoded per table lookup.

27. A storage medium encoded with machine-readable computer program code for decoding variable-length encoded (VLE) signals of an encoded bitstream, comprising:

(a) means for causing a computer to select a k-bit signal from the encoded bitstream;

(b) means for causing the computer to retrieve a table entry from a lookup table using the k-bit signal as an index into the lookup table;

(c) means for causing the computer to interpret the table entry to determine how many complete VLE signals are to be decoded from the k-bit signal; and (d) means for causing the computer to retrieve from the table entry at least two decoded signals, if the k-bit signal comprises at least two complete VLE signals to be decoded.

28. The storage medium of claim 27, further comprising:

(e) means for causing the computer to retrieve from the table entry one decoded signal, if the k-bit signal comprises one complete VLE signal to be decoded; and (f) means for causing the computer to perform special processing to decode the k-bit signal, if the k-bit signal comprises no complete VLE signals to be decoded, wherein the processing of means (a)–(f) is repeated for additional k-bit signals in the encoded bitstream and further comprising means for causing the computer to update, prior to repeating the processing of means (a)–(f) for a next k-bit signal, a bitstream pointer for use in means (a) based on how many bits were decoded by performing the processing of means (a)–(f) for a previous k-bit signal.

29. The storage medium of claim 27, wherein the table entry comprises:

a first value corresponding to how many bits in the k-bit signal correspond to the complete VLE signals;

a second value corresponding to how many complete VLE signals are in the k-bit signal;

a first decoded signal, if the second value indicates that the k-bit signal comprises at least one complete VLE signal; and a second decoded signal, if the second value indicates that the k-bit signal comprises at least two complete VLE signals.

30. The storage medium of claim 29, wherein the table entry further comprises:

a third value corresponding to a position of a special VLE signal in the k-bit signal; and a third decoded signal, if the second value indicates that the k-bit signal comprises at least three complete VLE signals.

31. The storage medium of claim 30, wherein:

the table entry comprises a 32-bit value;

the first value comprises bits 0–3 of the table entry;

the second value comprises bits 4–5 of the table entry;

the third value comprises bits 6–7 of the table entry;

the first decoded signal comprises bits 8–15 of the table entry;

the second decoded signal comprises bits 16–23 of the table entry; and the third decoded signal comprises bits 24–31 of the table entry.

32. The storage medium of claim 30, wherein the special VLE signal comprises an end-of-block signal.

33. The storage medium of claim 27, wherein means (c) causes the computer to:

interpret the table entry to determine whether the k-bit signal comprises a special VLE signal; and decode the special VLE signal, if the k-bit signal comprises the special VLE signal.

34. The apparatus of claim 33, wherein means (c) causes the computer to:

interpret the table entry to determine a position of the special VLE signal, if the k-bit signal comprises the special VLE signal; and decode the k-bit signal based on the position of the special VLE signal, if the k-bit signal comprises the special VLE signal.

35. The storage medium of claim 27, further comprising means for causing the computer to generate the lookup table at run time.

36. The storage medium of claim 35, wherein the lookup table is generated at run time based on a specified VLE codebook and specified parameters, including a first parameter corresponding to a value for k and a second parameter corresponding to a maximum number of VLE signals that can be decoded per table lookup.

37. The storage medium of claim 36, wherein parameters used to generate the VLE codebook are explicitly encoded into the bitstream.

38. The storage medium of claim 27, wherein the encoded bitstream comprises encoded video signals.

39. The storage medium of claim 27, wherein:

the encoded bitstream comprises encoded video signals;

the table entry comprises a 32-bit value;

the table entry comprises:

a first value corresponding to how many bits in the k-bit signal correspond to the complete VLE signals, the first value comprising bits 0–3 of the table entry;

a second value corresponding to how many complete VLE signals are in the k-bit signal, the second value comprising bits 4–5 of the table entry;

a third value corresponding to a position of a special VLE signal in the k-bit signal, the third value comprising bits 6–7 of the table entry and the special VLE signal comprising an end-of-block signal;

a first decoded signal, if the second value indicates that the k-bit signal comprises at least one complete VLE signal, the first decoded signal comprising bits 8–15 of the table entry;

a second decoded signal, if the second value indicates that the k-bit signal comprises at least two complete VLE signals, the second decoded signal comprising bits 16–23 of the table entry; and a third decoded signal, if the second value indicates that the k-bit signal comprises at least three complete VLE signals, the third decoded signal comprising bits 24–31 of the table entry;

means (c) causes the computer to:
   (1) interpret the table entry to determine whether the k-bit signal comprises the special VLE signal;
   (2) interpret the table entry to determine the position of the special VLE signal, if the k-bit signal comprises the special VLE signal; and
   (3) decode the k-bit signal based on the position of the special VLE signal, if the k-bit signal comprises the special VLE signal;

further comprising:
   (e) means for causing the computer to retrieve from the table entry one decoded signal, if the k-bit signal comprises one complete VLE signal to be decoded; and
   (f) means for causing the computer to perform special processing to decode the k-bit signal, if the k-bit signal comprises no complete VLE signals to be decoded;

the processing of means (a)–(f) is repeated for additional k-bit signals in the encoded bitstream;

further comprising means for causing the computer to update, prior to repeating the processing of means (a)–(f) for a next k-bit signal, a bitstream pointer for use in means (a) based on how many bits were decoded by performing the processing of means (a)–(f) for a previous k-bit signal; and further comprising means for causing the computer to generate the lookup table at run time based on a specified VLE codebook and specified parameters, including a first parameter corresponding to a value for k and a second parameter corresponding to a maximum number of VLE signals that can be decoded per table lookup.

* * * * *